United States Patent
Hsu

(10) Patent No.: US 10,665,627 B2
(45) Date of Patent: May 26, 2020

(54) IMAGE SENSOR DEVICE AND METHOD FOR FORMING THE IMAGE SENSOR DEVICE HAVING A FIRST LENS AND A SECOND LENS OVER THE FIRST LENS

(71) Applicant: Taiwan Semiconductor Manufacturing Co., Ltd., Hsinchu (TW)

(72) Inventor: Shih-Hsun Hsu, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/049,048

(22) Filed: Jul. 30, 2018

(65) Prior Publication Data
US 2019/0148434 A1  May 16, 2019

Related U.S. Application Data

(60) Provisional application No. 62/586,319, filed on Nov. 15, 2017.

(51) Int. Cl.
*H01L 27/146* (2006.01)

(52) U.S. Cl.
CPC .... *H01L 27/14627* (2013.01); *H01L 27/1463* (2013.01); *H01L 27/14621* (2013.01); *H01L 27/14623* (2013.01); *H01L 27/14629* (2013.01); *H01L 27/14632* (2013.01); *H01L 27/1464* (2013.01); *H01L 27/14603* (2013.01); *H01L 27/14645* (2013.01); *H01L 27/14685* (2013.01); *H01L 27/14689* (2013.01)

(58) Field of Classification Search
CPC .......... H01L 27/14645; H01L 27/1463; H01L 27/14627; H01L 27/14621; H01L 27/14685; H01L 27/14625; H01L 27/146; H01L 27/1464; H01L 27/14643; H01L 27/307; H01L 27/1462; H01L 33/60; H01L 33/62
See application file for complete search history.

(56) References Cited

U.S. PATENT DOCUMENTS 6,473,238 B1 * 10/2002 Daniell ................ H04N 13/307
                                                        359/622
7,075,164 B2 * 7/2006 Uya ................. H01L 27/14623
                                                        257/431

(Continued)

FOREIGN PATENT DOCUMENTS

CN       101097846 A       1/2008
CN       103066082 A       4/2013
(Continued)

*Primary Examiner* — Khiem D Nguyen
(74) *Attorney, Agent, or Firm* — Birch, Stewart, Kolasch & Birch, LLP

(57) ABSTRACT

A method for forming an image sensor device is provided. The method includes forming an isolation structure in a substrate. The method includes forming a light-sensing region in the substrate. The isolation structure surrounds the light-sensing region. The method includes forming a grid layer over the substrate. The grid layer is over the isolation structure and has an opening over the light-sensing region. The method includes forming a first lens in or over the opening. The method includes forming a second lens over the first lens and the grid layer.

19 Claims, 24 Drawing Sheets

(56) References Cited

U.S. PATENT DOCUMENTS

| | | | | |
|---|---|---|---|---|
| 9,373,732 | B2* | 6/2016 | Velichko | H01L 31/02327 |
| 2004/0189185 | A1* | 9/2004 | Yotsuya | H01L 51/5275 |
| | | | | 313/501 |
| 2005/0056901 | A1* | 3/2005 | Kuriyama | H01L 27/14621 |
| | | | | 257/428 |
| 2006/0113622 | A1* | 6/2006 | Adkisson | H01L 27/76819 |
| | | | | 257/443 |
| 2009/0090944 | A1* | 4/2009 | Park | H01L 27/14621 |
| | | | | 257/292 |
| 2009/0147101 | A1* | 6/2009 | Tatani | H01L 27/14621 |
| | | | | 348/224.1 |
| 2012/0009720 | A1* | 1/2012 | Shim | H01L 27/14625 |
| | | | | 438/70 |
| 2012/0104526 | A1* | 5/2012 | Olsen | G02B 3/0062 |
| | | | | 257/432 |
| 2012/0235266 | A1* | 9/2012 | Ootsuka | H01L 27/14623 |
| | | | | 257/432 |
| 2012/0248560 | A1* | 10/2012 | Lee | H01L 27/14627 |
| | | | | 257/432 |
| 2013/0270667 | A1* | 10/2013 | Wang | H01L 27/14621 |
| | | | | 257/443 |
| 2015/0155320 | A1* | 6/2015 | Chien | H01L 27/14623 |
| | | | | 257/432 |
| 2016/0276394 | A1* | 9/2016 | Chou | H01L 27/14645 |

FOREIGN PATENT DOCUMENTS

| | | |
|---|---|---|
| TW | 201143382 A1 | 12/2011 |
| TW | 201436186 A | 9/2014 |
| TW | 201733101 A | 9/2017 |
| TW | 201813070 A | 4/2018 |

\* cited by examiner

IMAGE SENSOR DEVICE AND METHOD FOR FORMING THE IMAGE SENSOR DEVICE HAVING A FIRST LENS AND A SECOND LENS OVER THE FIRST LENS

PRIORITY CLAIM AND CROSS-REFERENCE

This Application claims the benefit of U.S. Provisional Application No. 62/586,319, filed on Nov. 15, 2017, and entitled "Back-side illumination (BSI) image sensor with reduced optical cross-talk and method for forming the same", the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased. Such advances have increased the complexity of processing and manufacturing ICs. For these advances, similar developments in IC processing and manufacturing are needed.

Along with the advantages realized from reducing geometric size, improvements are being made directly to the IC devices. One such IC device is an image sensor device. An image sensor device includes a pixel array (or grid) for detecting light and recording intensity (brightness) of the detected light. The pixel array responds to the light by accumulating a charge. The higher the light intensity, the greater the charge that is accumulated in the pixel array. The accumulated charge is then used (for example, by other circuitry) to provide image information for use in a suitable application, such as a digital camera.

However, since the feature sizes continue to decrease, light collection efficiency of image sensor devices continue to become more difficult to improve. Therefore, it is a challenge to form image sensor devices with high light collection efficiency at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 is a top view of the semiconductor substrate and the isolation structure of FIG. 1A, in accordance with some embodiments.

FIG. 1C-1 is a top view of an intermediate structure of the image sensor device of FIG. 1C, in accordance with some embodiments.

FIG. 1F-1 is a top view of an intermediate structure of the image sensor device of FIG. 1F, in accordance with some embodiments.

FIG. 1G-1 is a top view of an intermediate structure of the image sensor device of FIG. 1G, in accordance with some embodiments.

FIG. 1H-1 is a top view of an intermediate structure of the image sensor device of FIG. 1H, in accordance with some embodiments.

DETAILED DESCRIPTION

Figure 1A:
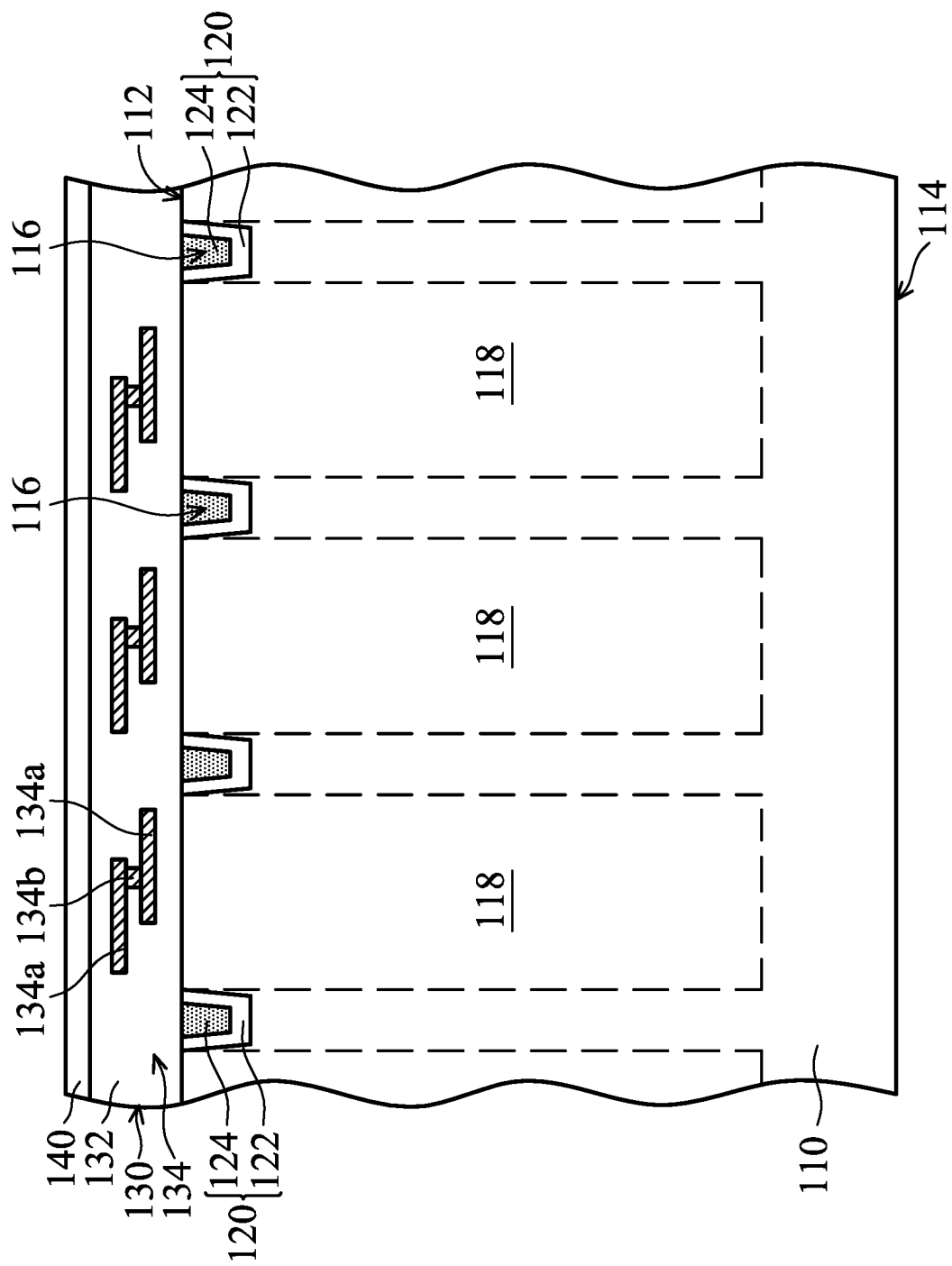
FIGS. 1A-1H are cross-sectional views of various stages of a process for forming an image sensor device, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1H are cross-sectional views of various stages of a process for forming an image sensor device 100, in accordance with some embodiments. As shown in FIG. 1A, a semiconductor substrate 110 is provided, in accordance with some embodiments. The semiconductor substrate 110 has a front surface 112 and a back surface 114 opposite to the front surface 112, in accordance with some embodiments.

The semiconductor substrate 110 may be a silicon substrate doped with a P-type dopant such as boron, in which case the semiconductor substrate 110 is a P-type substrate. Alternatively, the semiconductor substrate 110 could be doped with another suitable dopant. For example, the semiconductor substrate 110 may be a silicon substrate doped with an N-type dopant such as phosphorous or arsenic, in which case the semiconductor substrate 110 is an N-type substrate. The semiconductor substrate 110 may include elementary semiconductor materials such as germanium.

As shown in FIG. 1A, a portion of the semiconductor substrate 110 is removed to form a trench 116 in the semiconductor substrate 110, in accordance with some embodiments. The trench 116 extends from the front surface 112 into the semiconductor substrate 110, in accordance with some embodiments. The trench 116 surrounds portions of the semiconductor substrate 110, in accordance with some embodiments.

As shown in FIG. 1A, a liner layer 122 is formed in the trench 116, in accordance with some embodiments. The liner layer 122 includes oxide (such as silicon oxide), in accordance with some embodiments. The liner layer 122 is formed by a thermal oxidation process, in accordance with some embodiments.

As shown in FIG. 1A, an insulating layer 124 is formed over the liner layer 122, in accordance with some embodiments. The insulating layer 124 is filled in the trench 116, in accordance with some embodiments. The insulating layer 124 is made of silicon dioxide, silicon nitride, silicon oxynitride, fluoride-doped silicate glass (FSG), a low-K dielectric material, another suitable insulating material, or combinations thereof. The insulating layer 124 is formed using a deposition process, such as a chemical vapor deposition process, a physical vapor deposition process, or another suitable deposition process.

The insulating layer 124 and the liner layer 122 together form an isolation structure 120, in accordance with some embodiments. In some embodiments, the isolation structure 120 is used to define subsequently formed light-sensing regions in the semiconductor substrate 110, and to electrically isolate neighboring devices (e.g. transistors) from one another.

Figures 1, 1A:
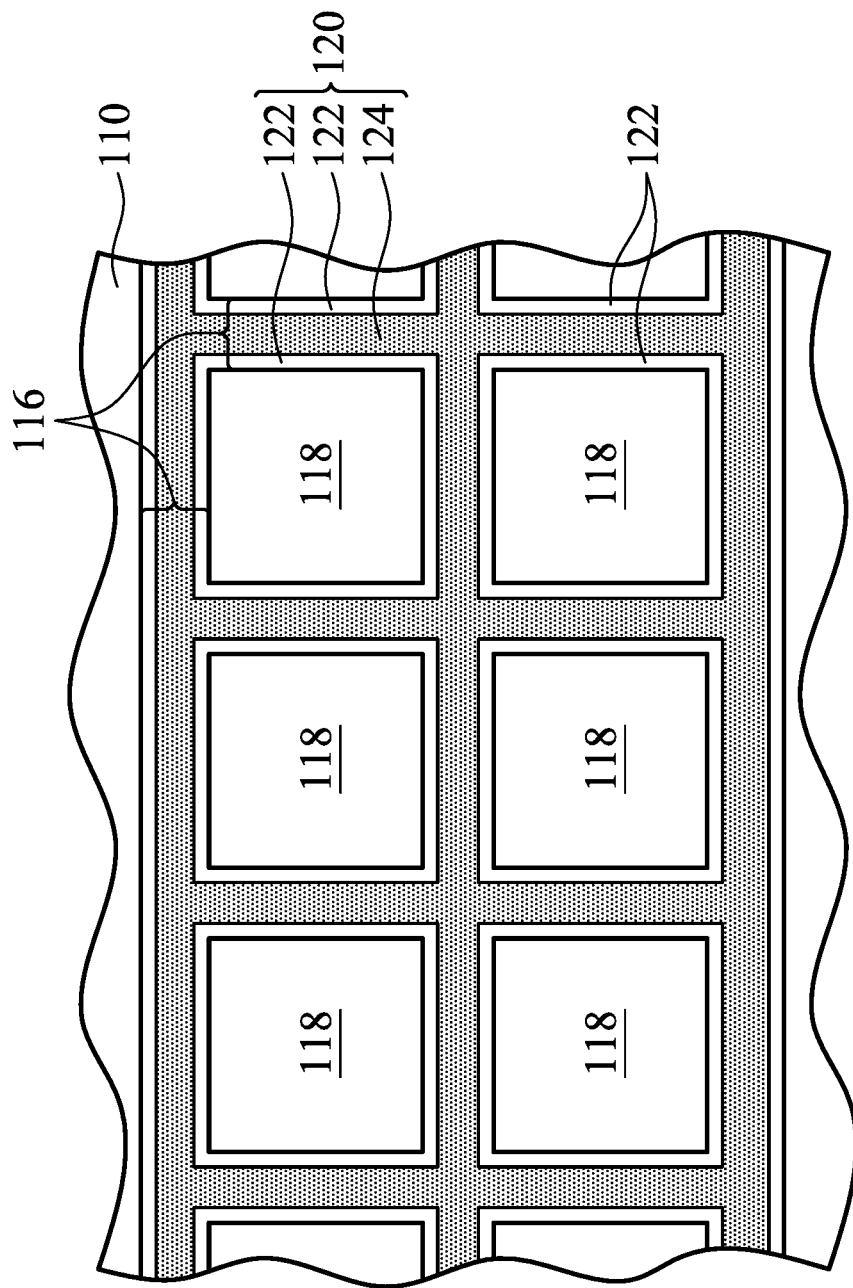

FIG. 1A-1 is a top view of the semiconductor substrate 110 and the isolation structure 120 of FIG. 1A, in accordance with some embodiments. As shown in FIGS. 1A and 1A-1, light-sensing regions 118 are formed in the portions of the semiconductor substrate 110 surrounded by the isolation structure 120, in accordance with some embodiments. The light-sensing regions 118 are also referred to as radiation-sensing regions, in accordance with some embodiments.

The light-sensing regions 118 are formed using one or more ion implantation processes or diffusion processes, in accordance with some embodiments. The light-sensing regions 118 are doped with a doping polarity opposite from that of the semiconductor substrate 110, in accordance with some embodiments. The light-sensing regions 118 extend from the front surface 112 into the semiconductor substrate 110, in accordance with some embodiments.

The light-sensing regions 118 are operable to sense incident light (or incident radiation) that enters the light-sensing regions 118. The incident light may be visible light. Alternatively, the incident light may be infrared (IR), ultraviolet (UV), X-ray, microwave, other suitable types of light, or a combination thereof.

Image sensing elements are formed over the light-sensing regions 118, and for the sake of simplicity, detailed structures of the image sensing elements are not shown in figures of the present disclosure, in accordance with some embodiments. The image sensing elements include pinned layers, photodiode gates, reset transistors, source follower transistors, and transfer transistors, in accordance with some embodiments.

The transfer transistors are electrically connected with the light-sensing regions 118 to collect (or pick up) electrons generated by incident light (or incident radiation) traveling into the light-sensing regions 118 and to convert the electrons into voltage signals, in accordance with some embodiments.

As shown in FIG. 1A, an interconnection structure 130 is formed over the front surface 112, in accordance with some embodiments. The interconnection structure 130 includes a number of patterned dielectric layers and conductive layers that couple to various doped features, circuitry, photodiode gates, reset transistors, source follower transistors, and transfer transistors. For example, the interconnection structure 130 includes an interlayer dielectric (ILD) layer 132 and a multilayer interconnection (MLI) structure 134 in the ILD layer 132.

The MLI structure 134 includes conductive lines 134a and vias (or contacts) 134b connected between the conductive lines 134a or between the conductive lines 134a and the image sensing elements (not shown). It should be understood that the conductive lines 134a and the vias 134b are merely exemplary. The actual positioning and configuration of the conductive lines 134a and the vias 134b may vary depending on design needs and manufacturing concerns.

Figure 1B:
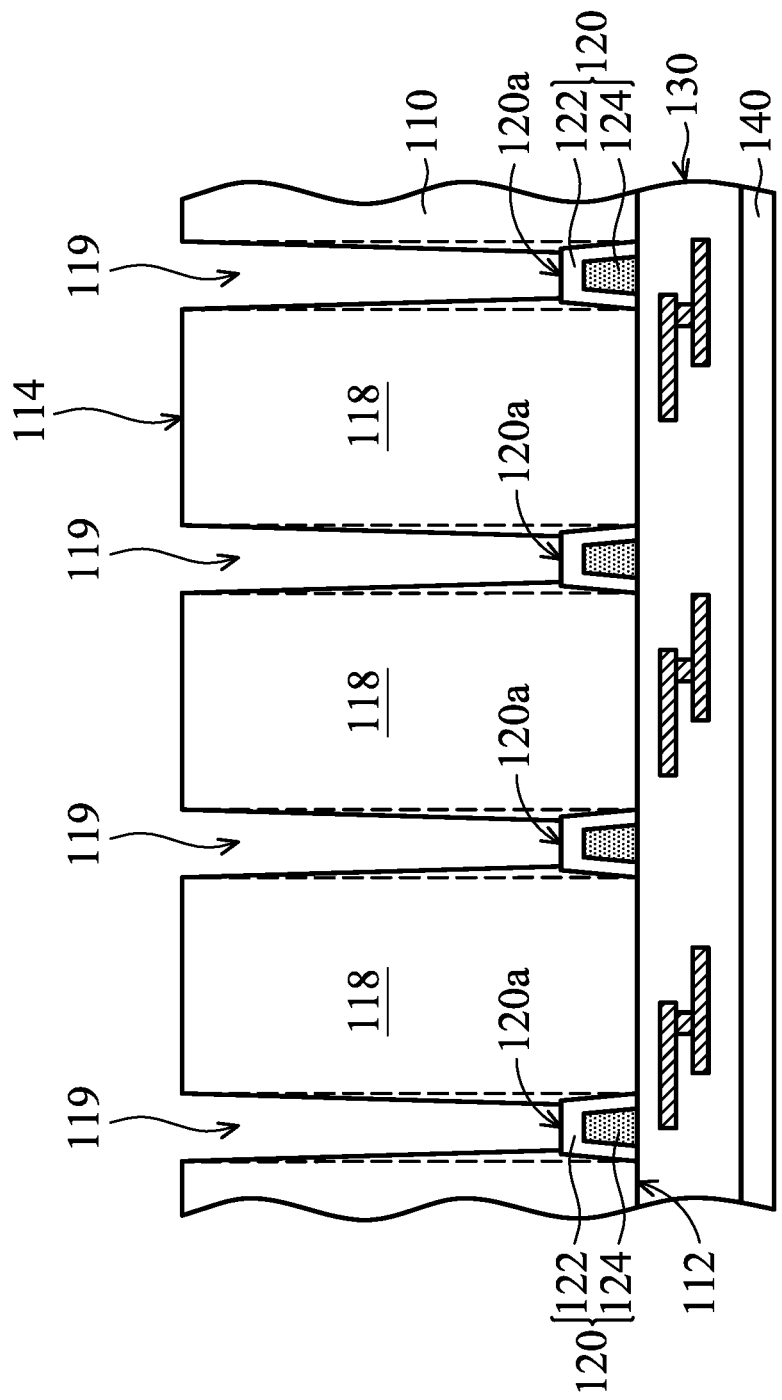

Afterwards, a carrier substrate 140 is bonded with the interconnection structure 130, in accordance with some embodiments. The carrier substrate 140 includes a silicon substrate, a glass substrate or another suitable substrate. Thereafter, as shown in FIGS. 1A and 1B, a thinning process is performed to thin the semiconductor substrate 110 from the back surface 114. The thinning process may include a chemical mechanical polishing process.

Afterwards, as shown in FIG. 1B, the semiconductor substrate 110 is flipped over, and a trench 119 is formed in the semiconductor substrate 110, in accordance with some embodiments. The trench 119 extends from the back surface 114 into the semiconductor substrate 110, in accordance with some embodiments. The trench 119 is between each two adjacent light-sensing regions 118, in accordance with some embodiments. The trench 119 surrounds each of the light-sensing regions 118, in accordance with some embodiments.

In some embodiments, the trench 119 is above the isolation structure 120. In some embodiments, the trench 119 exposes the isolation structure 120. The isolation structure 120 has a surface (or an end surface) 120a facing the back surface 114, in accordance with some embodiments. The trench 119 exposes the surface 120a, in accordance with some embodiments. The trench 119 exposes the liner layer 122, in accordance with some embodiments.

Figure 1C:
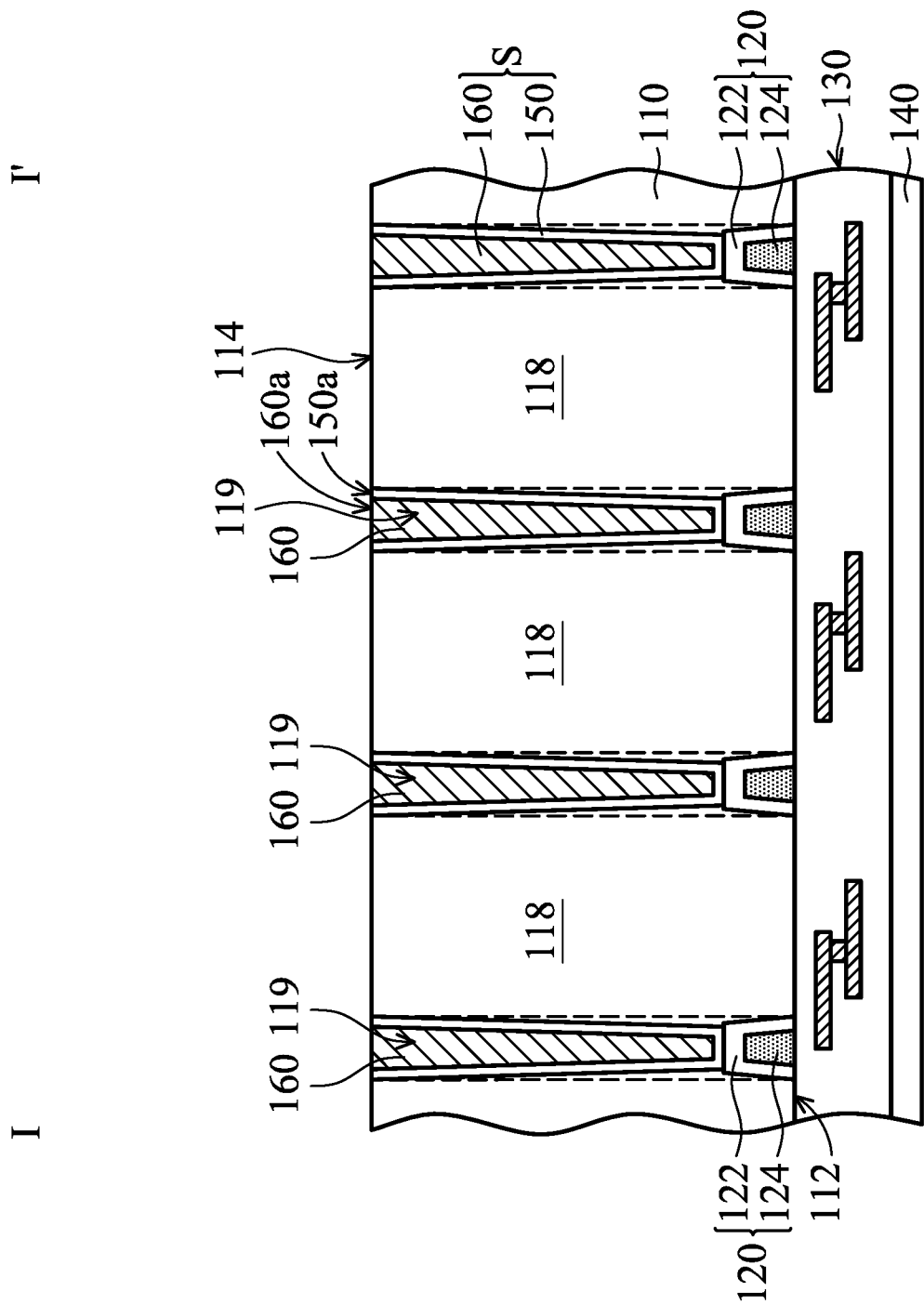
Figures 1, 1C:
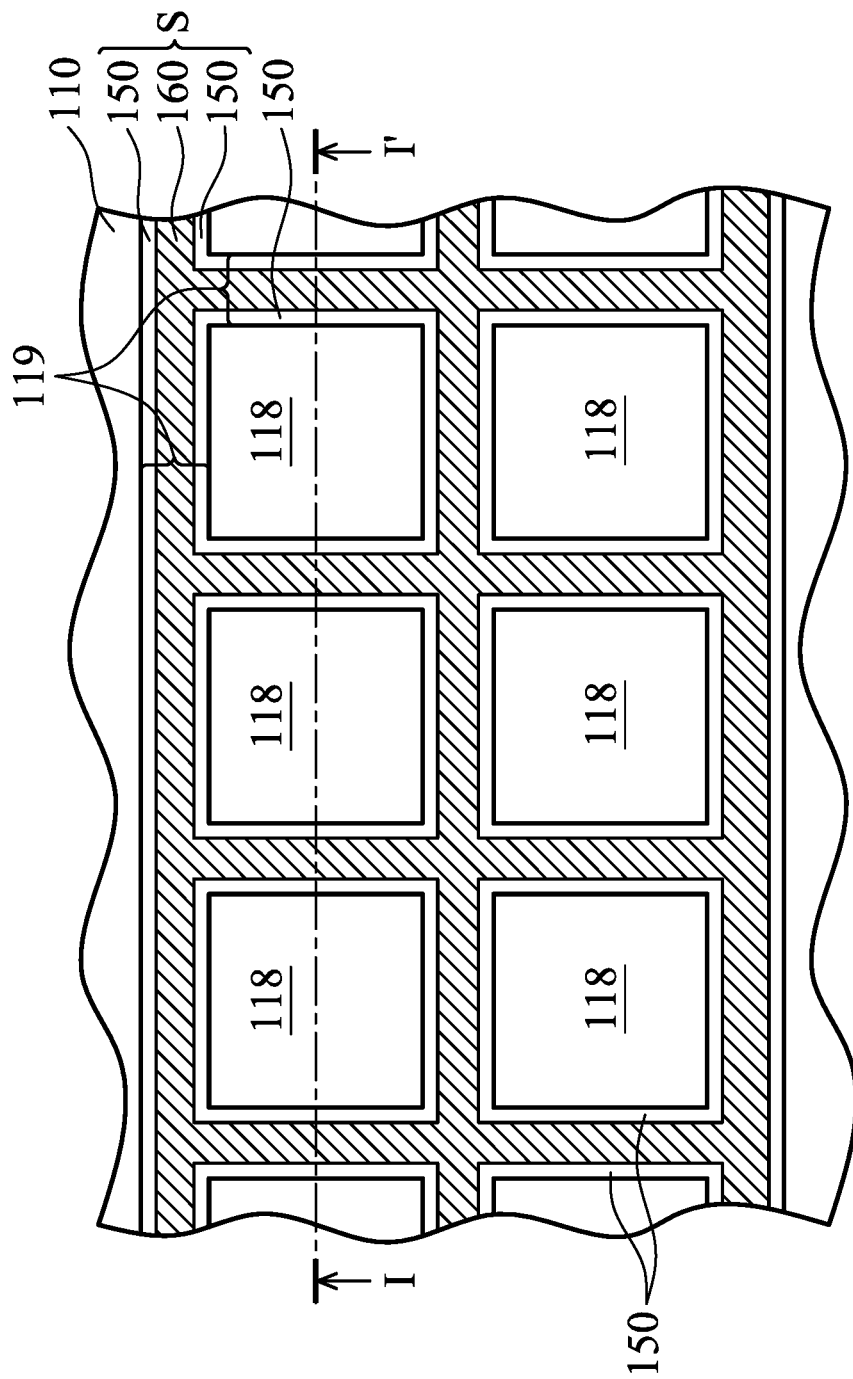

Afterwards, as shown in FIG. 1C, an insulating layer 150 is formed in the trench 119, in accordance with some embodiments. The insulating layer 150 is also referred to as a liner layer, in accordance with some embodiments. The insulating layer 150 is in direct contact with the isolation structure 120 and the semiconductor substrate 110, in accordance with some embodiments. The insulating layer 150 is in direct contact with the liner layer 122, in accordance with some embodiments.

In some embodiments, the insulating layer 150 is used to electrically isolate the light-sensing regions 118 from one another to reduce electrical crosstalk between the light-sensing regions 118. The insulating layer 150 includes silicon dioxide, in accordance with some embodiments. The insulating layer 150 includes a high-k material, a dielectric material, or other suitable insulating materials. The high-k material may include hafnium oxide, tantalum pentoxide, zirconium dioxide, aluminum oxide, other suitable materials, or a combination thereof.

The dielectric material includes, for example, silicon nitride, silicon oxynitride, other suitable materials, or a combination thereof. The insulating layer 150 is formed by, for example, a thermal oxidation process or a deposition process, such as a chemical vapor deposition process or a physical vapor deposition process.

Thereafter, as shown in FIG. 1C, a light-blocking structure 160 is formed in the trench 119, in accordance with some embodiments. The light-blocking structure 160 is formed over the insulating layer 150, in accordance with some embodiments. A top surface 150a of the insulating layer 150 and a top surface 160a of the light-blocking structure 160 are substantially coplanar, in accordance with some embodiments.

The light-blocking structure 160 and the insulating layer 150 together form an isolation structure S, in accordance with some embodiments. In some embodiments, the isolation structure S is used to separate the light-sensing regions 118 from one another, and to electrically isolate neighboring devices (e.g. transistors) from one another.

The isolation structure S extends from the back surface 114 into the semiconductor substrate 110, in accordance with some embodiments. The isolation structure S surrounds each of the light-sensing regions 118, in accordance with some embodiments. The isolation structure S is substantially aligned with the isolation structure 120, in accordance with some embodiments.

The isolation structure S is in direct contact with the isolation structure 120, in accordance with some embodiments. The isolation structures 120 and S may reduce optical crosstalk and electrical crosstalk between adjacent light-sensing regions 118.

FIG. 1C-1 is a top view of an intermediate structure of the image sensor device of FIG. 1C, in accordance with some embodiments. FIG. 1C is a cross-sectional view illustrating the intermediate structure of the image sensor device along a sectional line I-I' in FIG. 1C-1, in accordance with some embodiments. As shown in FIGS. 1C and 1C-1, the trench 119 and the isolation structure S therein surround each of the light-sensing regions 118, in accordance with some embodiments.

The insulating layer 150 is between the light-blocking structure 160 and the semiconductor substrate 110 to separate the light-blocking structure 160 from the semiconductor substrate 110, in accordance with some embodiments. The insulating layer 150 electrically insulates the light-blocking structure 160 from the semiconductor substrate 110, in accordance with some embodiments.

The trench 119 is filled with the insulating layer 150 and the light-blocking structure 160, in accordance with some embodiments. The light-blocking structure 160 is between each two adjacent light-sensing regions 118, in accordance with some embodiments. The light-blocking structure 160 is used to block incident light to prevent the incident light from traveling between different light-sensing regions 118, in accordance with some embodiments.

In some embodiments, the light-blocking structure 160 includes a light reflection structure. In some embodiments, the light reflection structure has a lower refractive index than that of the semiconductor substrate 110, and therefore a portion of the incident light arriving at the light reflection structure is reflected, which is a phenomenon called "total internal reflection". The light reflection structure includes dielectric materials, such as silicon dioxides, silicon nitrides, or silicon carbides.

In some embodiments, the light reflection structure has a light reflectivity ranging from about 60% to about 100%. In some embodiments, the light reflection structure includes a metal material or an alloy material. The light reflection structure includes Al, W, Cu, Ti, an alloy thereof, a combination thereof, or another suitable reflective material.

Alternatively, in some embodiments, the light-blocking structure 160 includes a light absorption structure. In some embodiments, the light absorption structure has a light absorptivity ranging from about 60% to about 100%. In some embodiments, the light absorption structure is used to absorb the incident light arriving at the light absorption structure to prevent the incident light from traveling between different light-sensing regions 118.

In some embodiments, the light absorption structure includes a black silicon material, a semiconductor material with a band gap smaller than 1.5 eV (e.g., Ge, InSb, or InAs), or a polymer material (e.g., an opaque polymer material). In some embodiments, the light absorption structure includes a non-visible light filter (e.g. an IR filter or a UV filter) enabled to block visible light and transmit non-visible light.

In some embodiments, the method of forming the light-blocking structure 160 includes depositing a light-blocking material layer on the semiconductor substrate 110 and filled in the trench 119; and removing the light-blocking material layer outside of the trench 119.

The method of depositing the light-blocking material layer includes performing a chemical vapor deposition (CVD) process, a physical vapor deposition (PVD) process, a coating process, or another suitable process. The method of removing the light-blocking material layer outside of the trench 119 includes performing a chemical mechanical polishing (CMP) process or another suitable process.

Figure 1D:
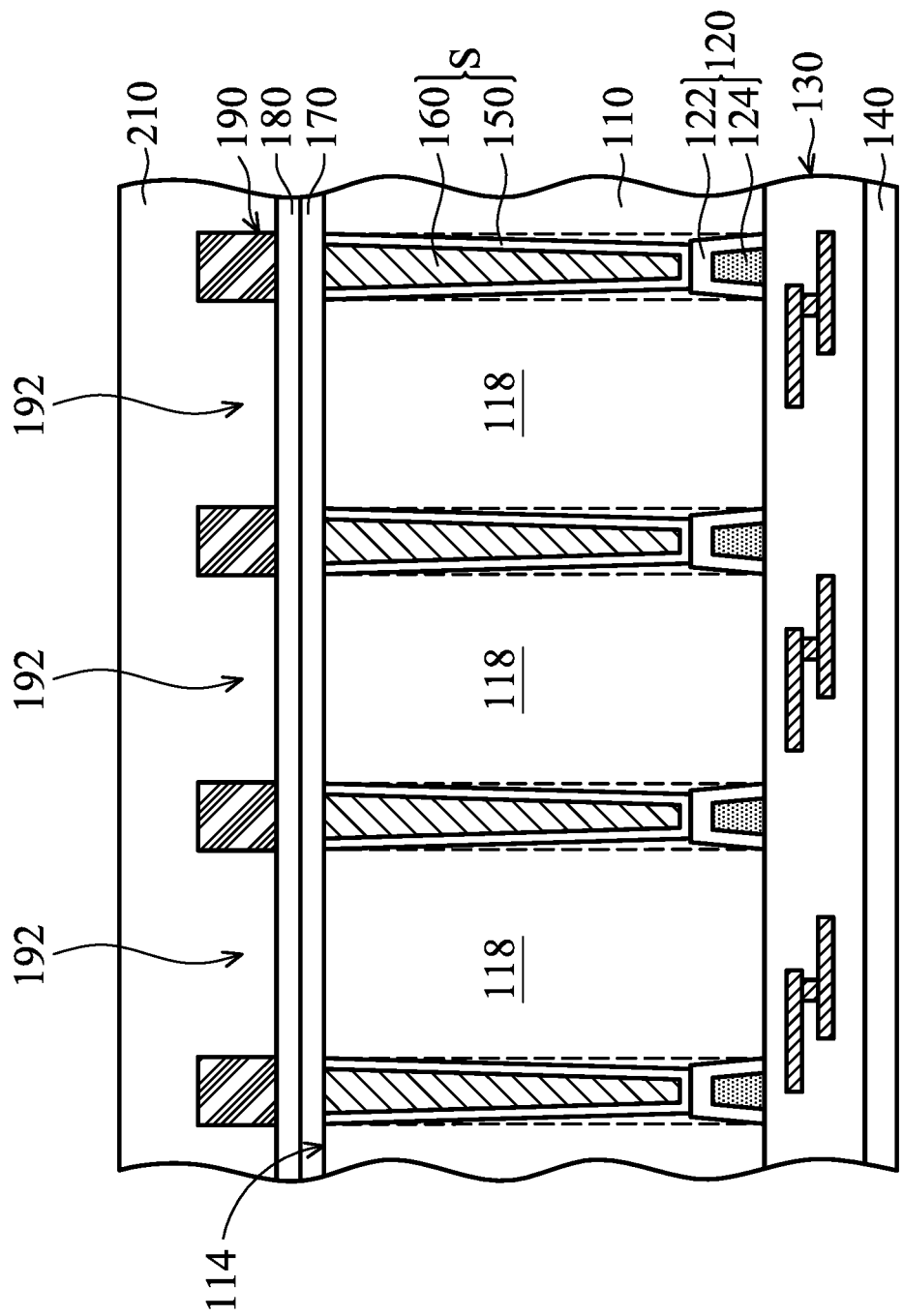

Thereafter, as shown in FIG. 1D, an anti-reflection coating (ARC) layer 170 and a buffer layer 180 are sequentially formed over the back surface 114 of the semiconductor substrate 110, in accordance with some embodiments. The ARC layer 170 is used to reduce optical reflection from the back surface 114 of the semiconductor substrate 110 to ensure that most of an incident light enters the light-sensing regions 118 and is sensed.

The ARC layer 170 may be made of a high-k material, a dielectric material, other applicable materials, or a combination thereof. The high-k material may include hafnium oxide, tantalum pentoxide, zirconium dioxide, aluminum oxide, other suitable materials, or a combination thereof. The dielectric material includes, for example, silicon nitride, silicon oxynitride, other suitable materials, or a combination thereof.

The buffer layer 180 is used as a buffer between the ARC layer 170 and subsequently formed overlying layers. The buffer layer 180 may be made of a dielectric material or other suitable materials. For example, the buffer layer 180 is made of silicon dioxide, silicon nitride, silicon oxynitride, other applicable materials, or a combination thereof.

Thereafter, as shown in FIG. 1D, a grid layer 190 is formed over the buffer layer 180, in accordance with some embodiments. The grid layer 190 is over the isolation structures S and 120, in accordance with some embodiments. The grid layer 190 and the isolation structures S and 120 are aligned with each other, in accordance with some embodiments. The isolation structure S is between the grid layer 190 and the isolation structure 120, in accordance with some embodiments.

The grid layer 190 has openings 192, in accordance with some embodiments. The openings 192 expose portions of the buffer layer 180, in accordance with some embodiments. The openings 192 are respectively and directly over the light-sensing regions 118, in accordance with some embodiments. The grid layer 190 is used to prevent the incident light from entering a neighboring light-sensing region 118, in accordance with some embodiments. The crosstalk problems between the light-sensing regions 118 are thus prevented or reduced.

In some embodiments, the grid layer 190 is made of a reflective material such as a metal material. The grid layer 190 may be made of aluminum, silver, copper, titanium, platinum, tungsten, tantalum, tantalum nitride, other suitable materials, or a combination thereof. In some embodiments, the grid layer 190 is made of an oxide material such as silicon oxide. In some embodiments, the grid layer 190 is formed over the buffer layer 180 using a suitable process. The suitable process includes, for example, a PVD process, an electroplating process, a CVD process, other applicable processes, or a combination thereof.

Afterwards, as shown in FIG. 1D, a transparent layer 210 is formed over the grid layer 190 and the buffer layer 180, in accordance with some embodiments. The transparent layer 210 is filled into the openings 192, in accordance with some embodiments. The transparent layer 210 is made of oxides (e.g., silicon dioxide), nitrides (e.g., silicon nitride), oxide nitrides (e.g., silicon oxynitride), a polymer material, or another suitable transparent material through which light (e.g., visible light or invisible light) can pass, in accordance with some embodiments.

In some embodiments, the transparent layer 210 and the grid layer 190 are made of different materials, in accordance with some embodiments. The transparent layer 210 is formed using a chemical vapor deposition process, a physical vapor deposition process, another suitable deposition process, a spin coating process, or another suitable process.

Figure 1E:
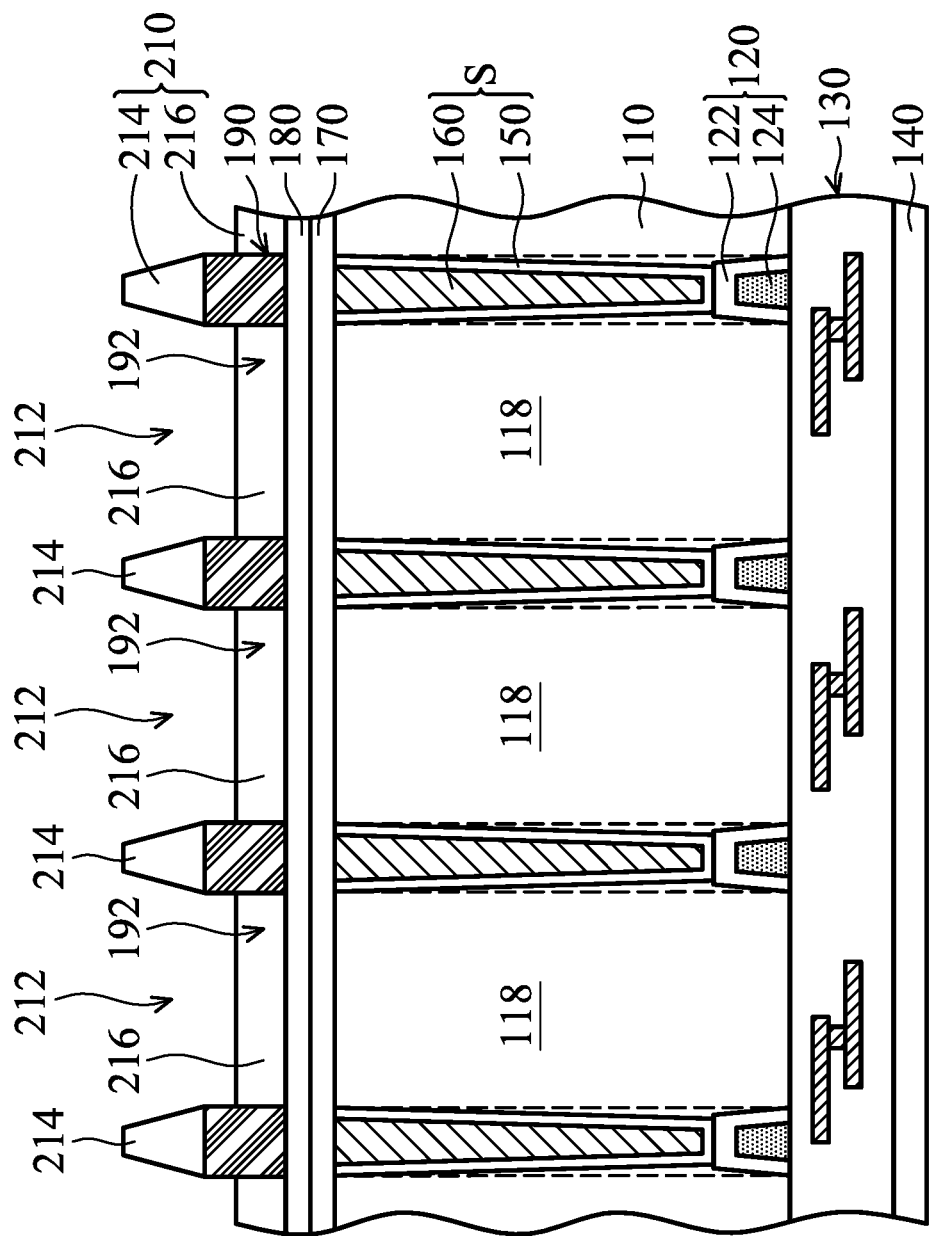

Thereafter, as shown in FIG. 1E, portions of the transparent layer 210 are removed to form recesses 212 in the transparent layer 210, in accordance with some embodiments. The recesses 212 are right over the openings 192, in accordance with some embodiments. The recesses 212 extend into the openings 192, in accordance with some embodiments.

After the removal process of the portions of the transparent layer 210, the transparent layer 210 remaining over the grid layer 190 forms a spacer structure 214, in accordance with some embodiments. The spacer structure 214 continuously surrounds the recesses 212, in accordance with some embodiments.

After the removal process of the portions of the transparent layer 210, the transparent layer 210 remaining in the openings 192 forms base layers 216, in accordance with some embodiments. The base layers 216 are respectively in the openings 192, in accordance with some embodiments.

The base layers 216 are respectively under the recesses 212, in accordance with some embodiments. The base layers 216 are separated from each other by the grid layer 190 therebetween, in accordance with some embodiments. The portions of the transparent layer 210 are removed using an etching process, such as a dry etching process, in accordance with some embodiments.

Figure 1F:
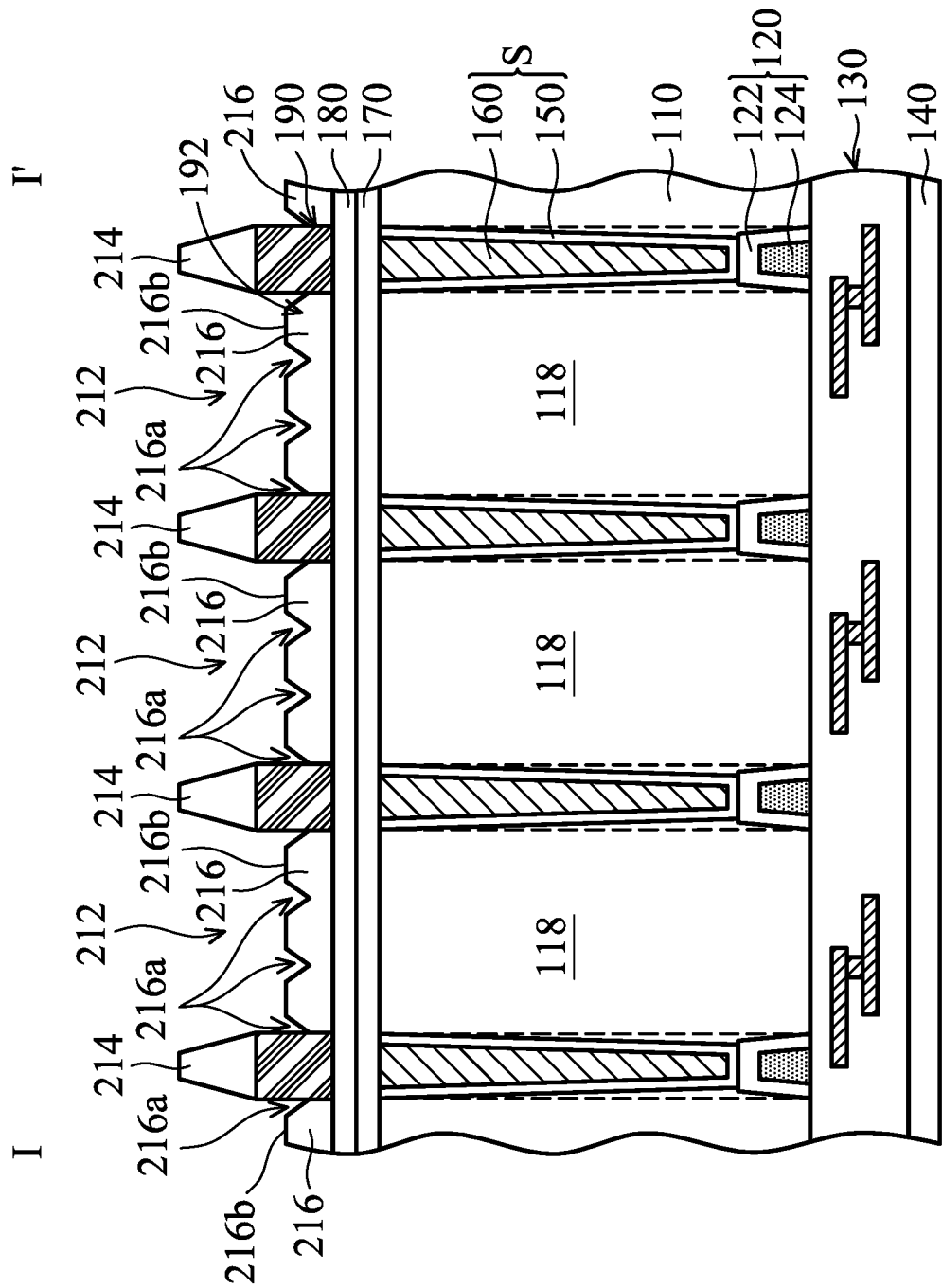
Figures 1, 1F:
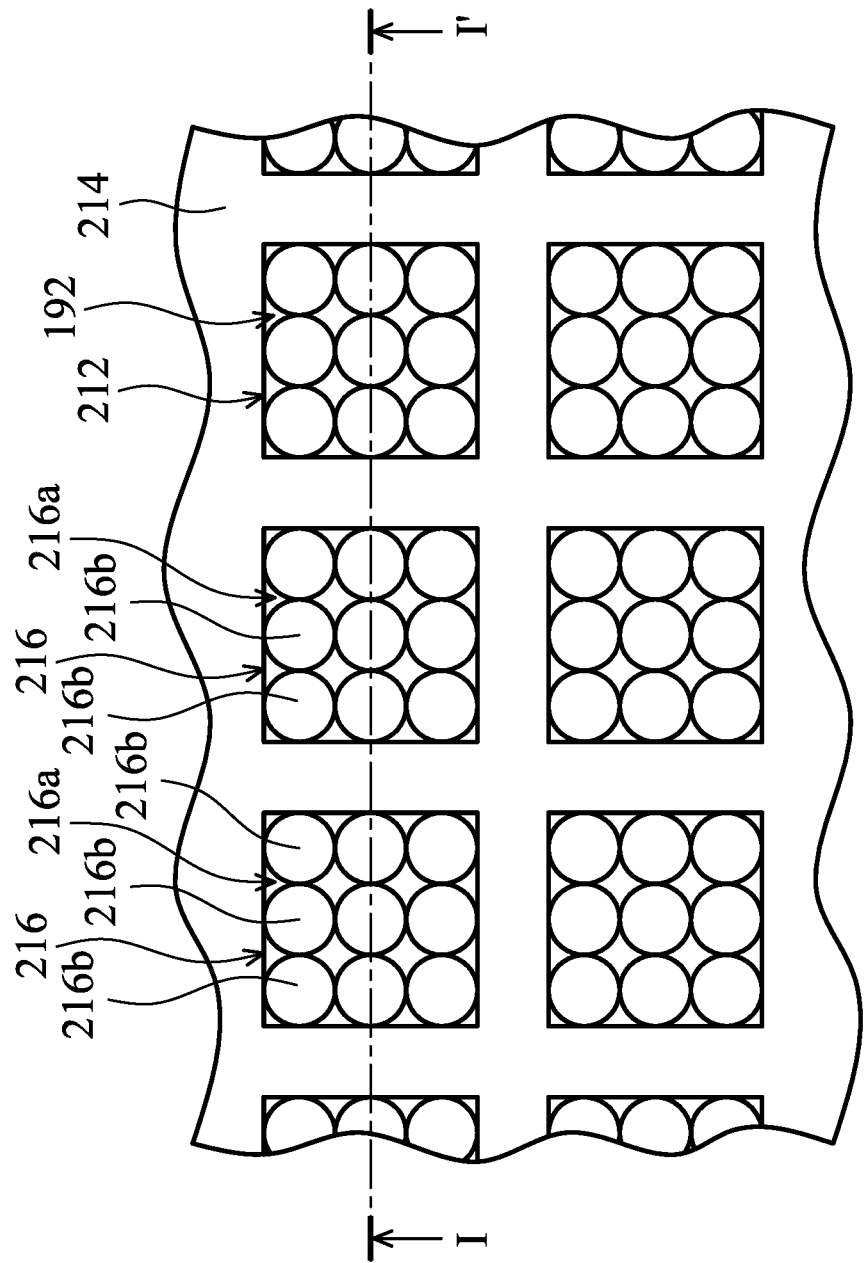

FIG. 1F-1 is a top view of an intermediate structure of the image sensor device of FIG. 1F, in accordance with some embodiments. FIG. 1F is a cross-sectional view illustrating the intermediate structure of the image sensor device along a sectional line I-I' in FIG. 1F-1, in accordance with some embodiments.

Afterwards, as shown in FIGS. 1F and 1F-1, portions of the base layers 216 are removed to form a trench 216a in each of the base layers 216, in accordance with some embodiments. The trench 216a surrounds portions 216b of the corresponding base layer 216, in accordance with some embodiments. As shown in FIG. 1F-1, the portions 216b have a round shape, in accordance with some embodiments. The trench 216a is directly connected with the recess 212 thereover, in accordance with some embodiments. The portions of the base layers 216 are removed using an etching process, such as a dry etching process, in accordance with some embodiments.

Figure 1G:
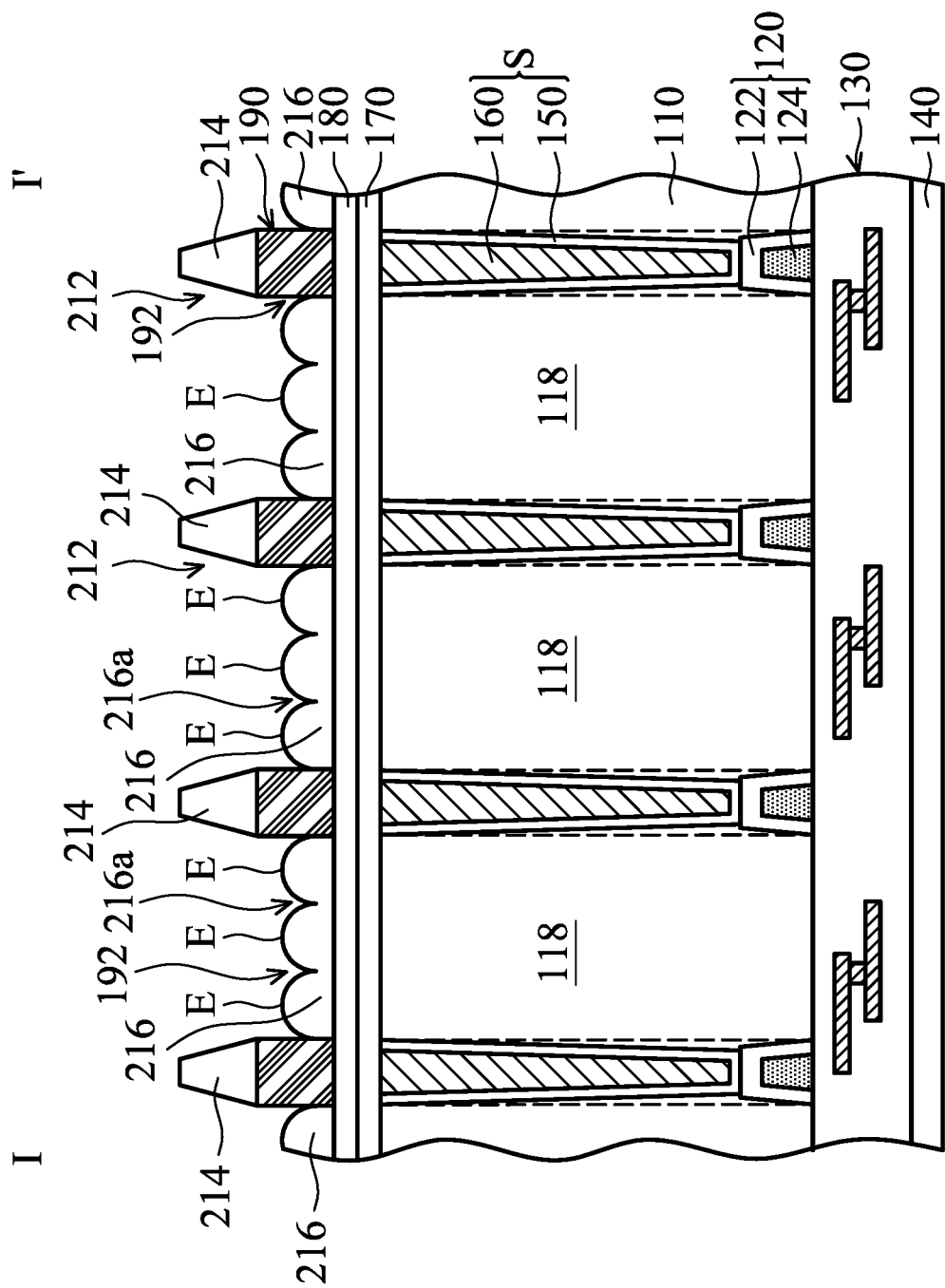
Figures 1, 1G:
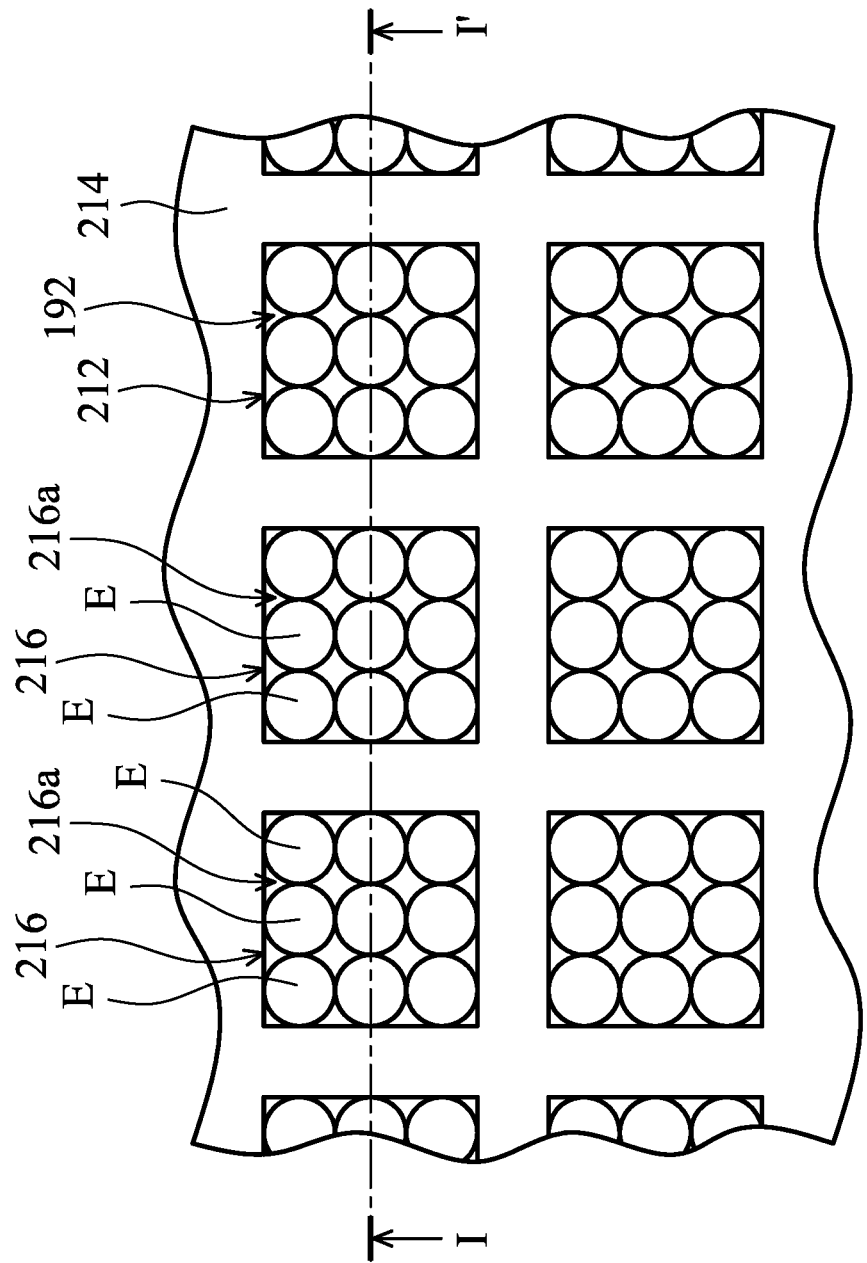

FIG. 1G-1 is a top view of an intermediate structure of the image sensor device of FIG. 1G, in accordance with some embodiments. FIG. 1G is a cross-sectional view illustrating the intermediate structure of the image sensor device along a sectional line I-I' in FIG. 1G-1, in accordance with some embodiments.

Thereafter, as shown in FIGS. 1G and 1G-1, the portions 216b are rounded to form lenses E, in accordance with some embodiments. The lenses E are under the recesses 212, in accordance with some embodiments. The lenses E are entirely or partially in the openings 192, in accordance with some embodiments. The lenses E are formed from the portions 216b, in accordance with some embodiments. The lenses E and the spacer structure 214 are made of the same material, in accordance with some embodiments. Each trench 216a continuously surrounds the corresponding lenses E, in accordance with some embodiments.

In some embodiments, the portions 216b are rounded by performing a reflow process over the portions 216b of the base layers 216. The process temperature of the reflow process ranges from about 50° C. to about 600° C., in accordance with some embodiments. In some embodiments, the process temperature of the reflow process ranges from about 100° C. to about 600° C. In some other embodiments, the portions 216b are rounded by performing a wet etching process over the portions 216b of the base layers 216.

Figure 2:
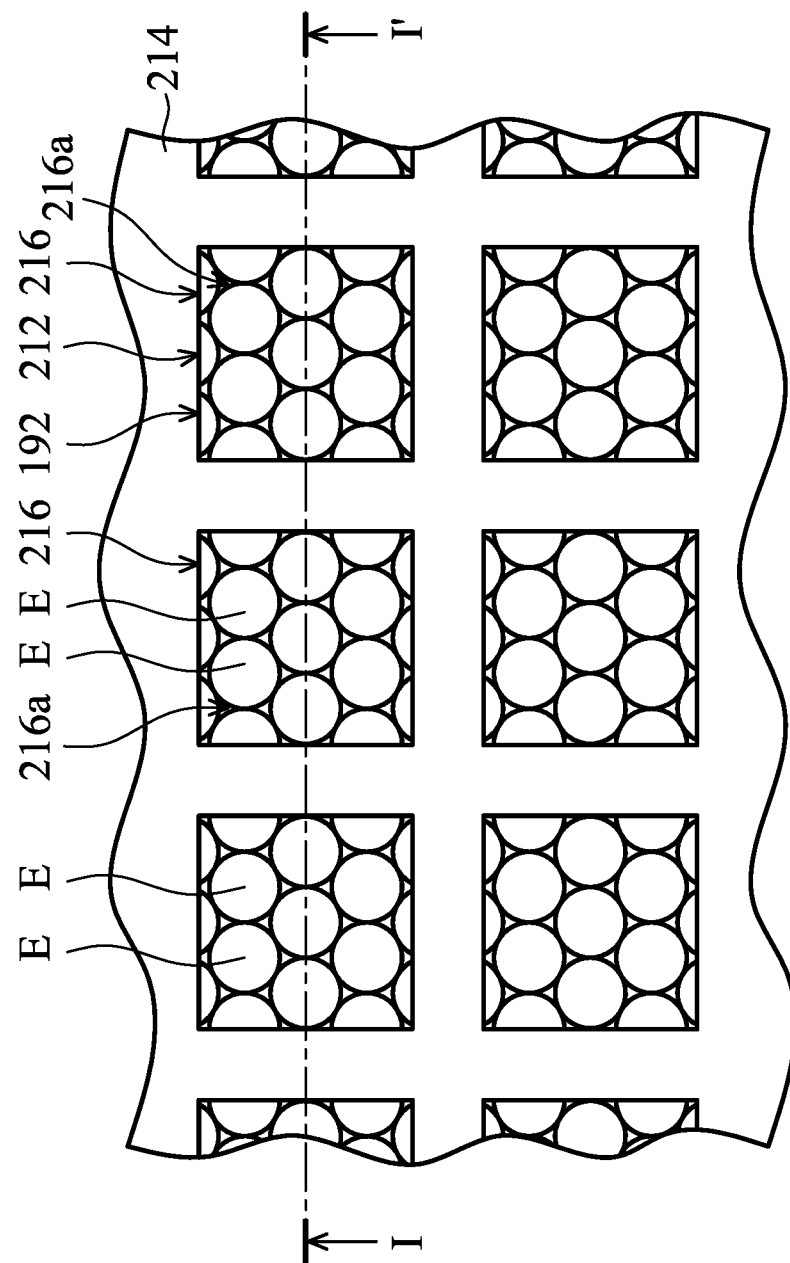
FIG. 2 is a top view of a variation of the intermediate structure of the image sensor device of FIG. 1G-1, in accordance with some embodiments.

The lenses E may include a grid lens array, in accordance with some embodiments. As shown in FIG. 1G-1, the lenses E are arranged in a square arrangement, in accordance with some embodiments. In some other embodiments, the lenses E are arranged in a hexagonal arrangement (as shown in FIG. 2).

Figure 3:
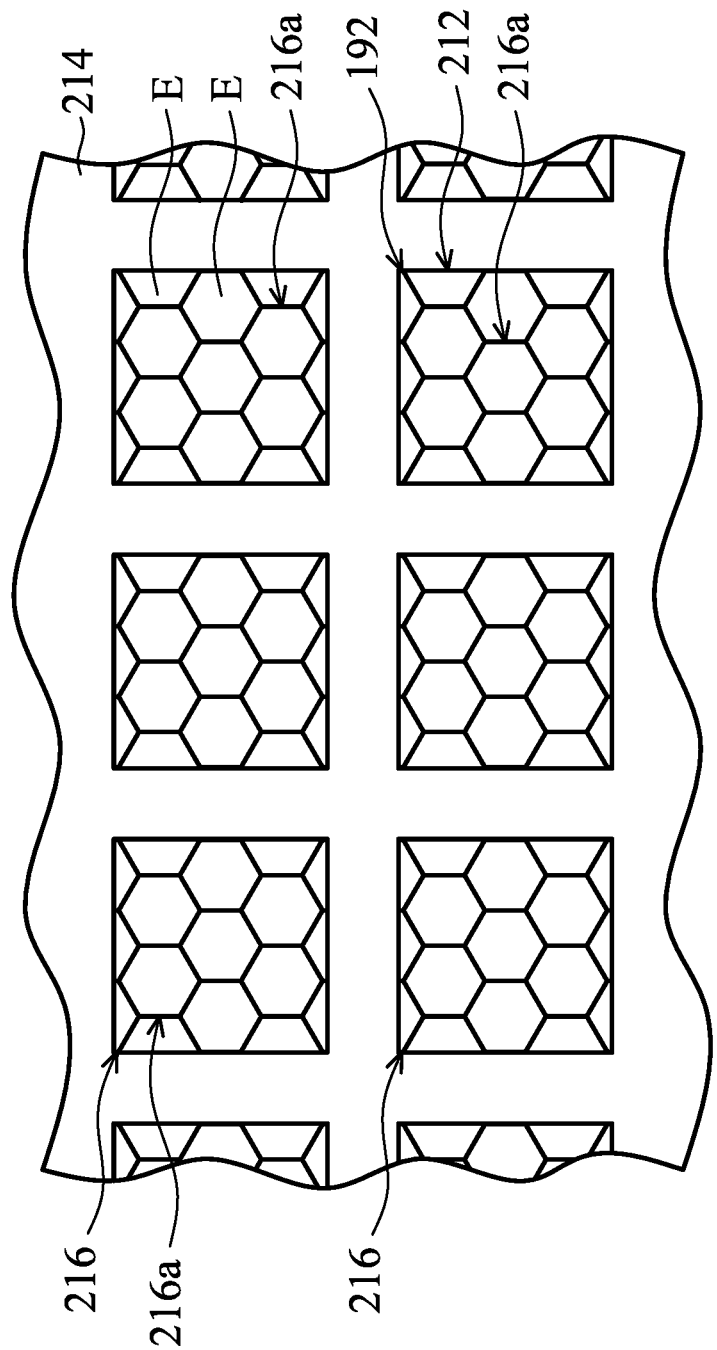
FIG. 3 is a top view of a variation of the intermediate structure of the image sensor device of FIG. 1G-1, in accordance with some embodiments.
Figure 4A:
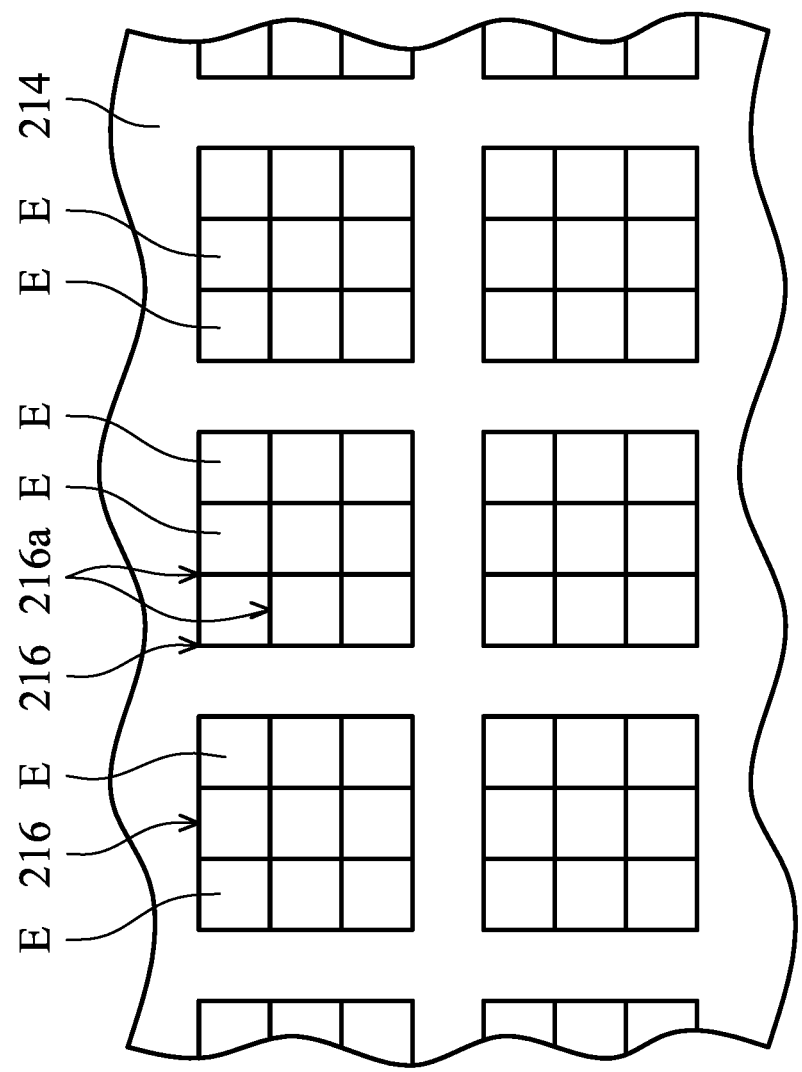
FIG. 4A is a top view of a variation of the intermediate structure of the image sensor device of FIG. 1G-1, in accordance with some embodiments.
Figure 4B:
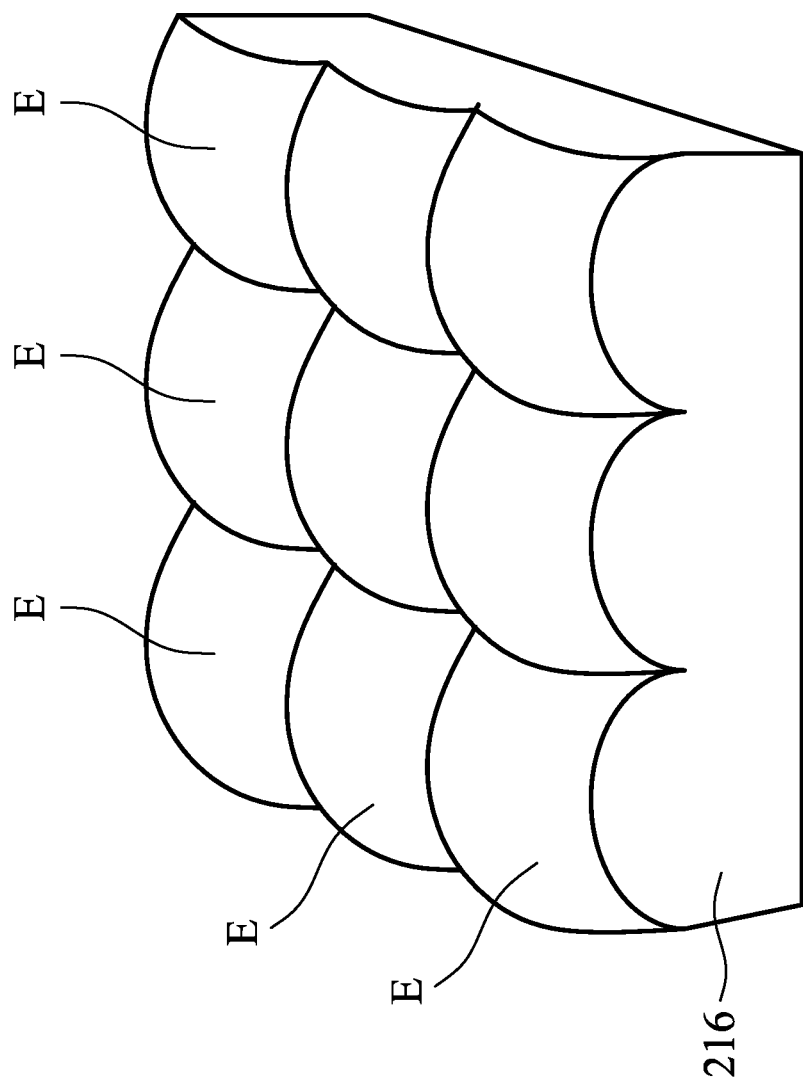
FIG. 4B is a perspective view of the lenses of FIG. 4A, in accordance with some embodiments.

As shown in FIG. 1G-1, the lenses E have a round shape, in accordance with some embodiments. In some other embodiments, the lenses E have a hexagonal shape (as shown in FIG. 3). In another embodiment, the lenses E have a tetragonal shape, such as a square shape (as shown in FIGS. 4A and 4B). FIG. 4B is a perspective view of the lenses E of FIG. 4A, in accordance with some embodiments.

Figure 1H:
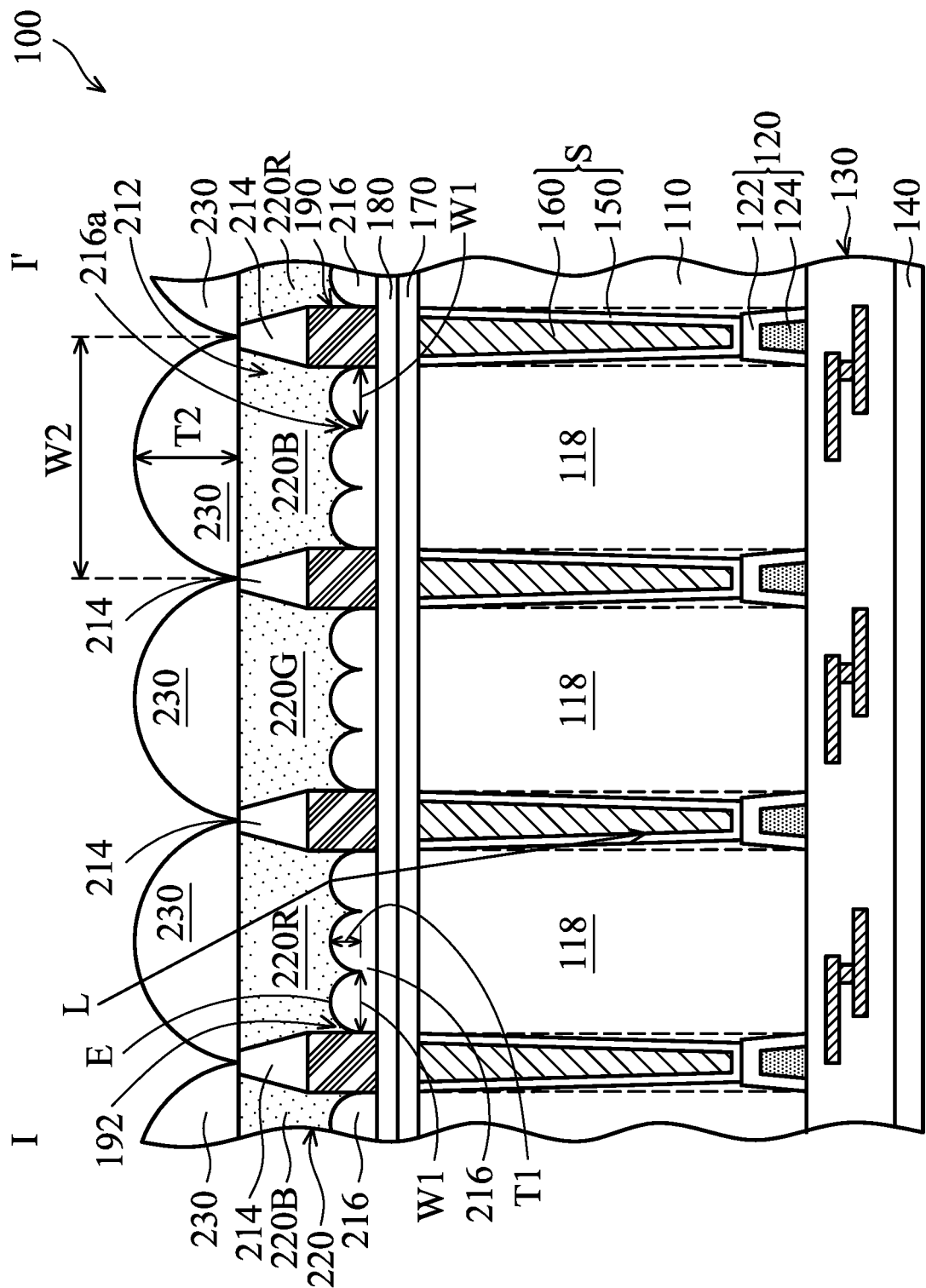
Figures 1, 1H:
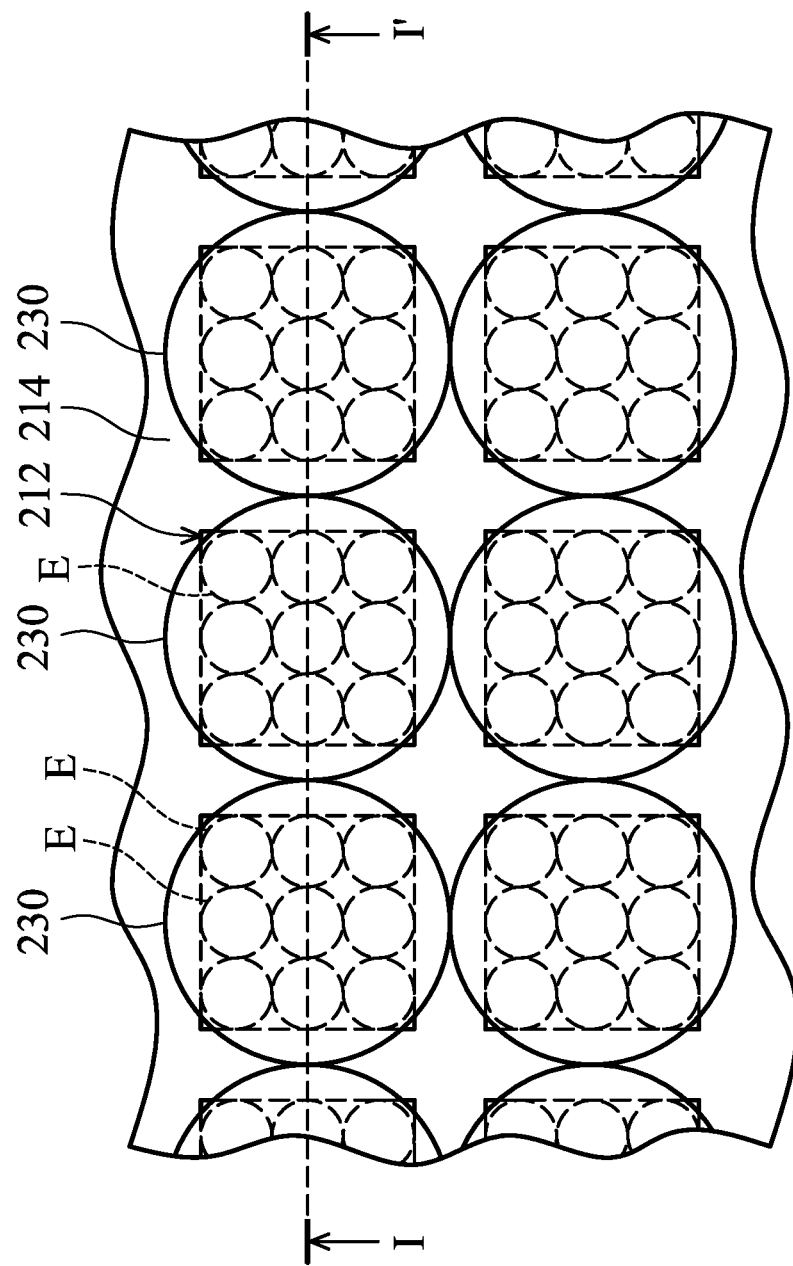

FIG. 1H-1 is a top view of an intermediate structure of the image sensor device of FIG. 1H, in accordance with some embodiments. FIG. 1H is a cross-sectional view illustrating the intermediate structure of the image sensor device along a sectional line I-I' in FIG. 1H-1, in accordance with some embodiments.

Afterwards, as shown in FIGS. 1H and 1H-1, a color filter layer 220 is formed in the recesses 212 and the trenches 216a, in accordance with some embodiments. The color filter layer 220 covers the lenses E, in accordance with some embodiments. The color filter layer 220 is in direct contact with the lenses E, in accordance with some embodiments. The color filter layer 220 in the trenches 216a surrounds the lenses E, in accordance with some embodiments.

In some embodiments, the color filter layer 220 includes visible light filters, such as color filters 220R, 220G, and 220B. In some embodiments, the visible light filters may be used to filter through visible light. The color filters 220R, 220G, and 220B may be used to filter through a red wavelength band, a green wavelength band, and a blue wavelength band, respectively. In some embodiments, the light-blocking structure 160 includes an invisible light filter (e.g. an IR filter or a UV filter) enabled to block the visible light passing though the visible light filters.

The spacer structure 214 surrounds the color filters 220R, 220G, and 220B, in accordance with some embodiments. In some embodiments (not shown), the spacer structure 214 is not formed.

Afterwards, as shown in FIGS. 1H and 1H-1, lenses 230 are respectively formed over the color filters 220R, 220G, and 220B, in accordance with some embodiments. The lenses 230 are over the lenses E and the grid layer 190, in accordance with some embodiments. In some embodiments, a maximum thickness T1 of the lens E is less than a maximum thickness T2 of the lens 230.

In some embodiments, a maximum width W1 of the lens E is less than a maximum width W2 of the lens 230. In some embodiments, the lenses E have the same maximum width W1. In some other embodiments, the lenses E have different maximum widths. In some embodiments, the lenses 230 have the same maximum width W2. In some other embodiments, the lenses 230 have different maximum widths.

In some embodiments, a sum of the maximum widths W1 of the lenses E in the same opening 192 (or under the same recess 212) and arranged in the same line is less than the maximum width W2 of the lens 230. The color filter layer 220 is between the lenses E and 230, in accordance with some embodiments. The color filter layer 220 is in direct contact with the lenses 230, in accordance with some embodiments.

The lenses 230 are used to direct or focus the incident light, in accordance with some embodiments. The lenses 230 may include a microlens array. The lenses 230 may be made of a high transmittance material. For example, the high transmittance material includes transparent polymer material (such as polymethylmethacrylate, PMMA), transparent ceramic material (such as glass), other applicable materials, or a combination thereof. In this step, an image sensor device 100 is substantially formed, in accordance with some embodiments.

In some embodiments, the lenses 230 and E are made of the same material. In some other embodiments, the lenses 230 and E are made of different materials. In some embodiments, the refractive index of the material of the lenses 230 is less than the refractive index of the material of the lenses E.

As shown in FIG. 1H, an incident light L sequentially passes through the lens 230, the color filters 220R, and the lens E, in accordance with some embodiments. Since the lens E directs (or focuses) the incident light L, the incident light L arrives at the light-blocking structure 160 (instead of passes through the gap between the grid layer 190 and the light-blocking structure 160) and is absorbed or reflected by the light-blocking structure 160, in accordance with some embodiments. Therefore, the lens E may reduce optical crosstalk between adjacent light-sensing regions 118, in accordance with some embodiments. As a result, the lens E improves the light collection efficiency of the image sensor device 100, in accordance with some embodiments.

In the image sensor device 100, the isolation structure 120 extends from the front surface 112 into the semiconductor substrate 110, in accordance with some embodiments. The isolation structure 120 surrounds the light-sensing regions 118, in accordance with some embodiments.

Figure 5A:
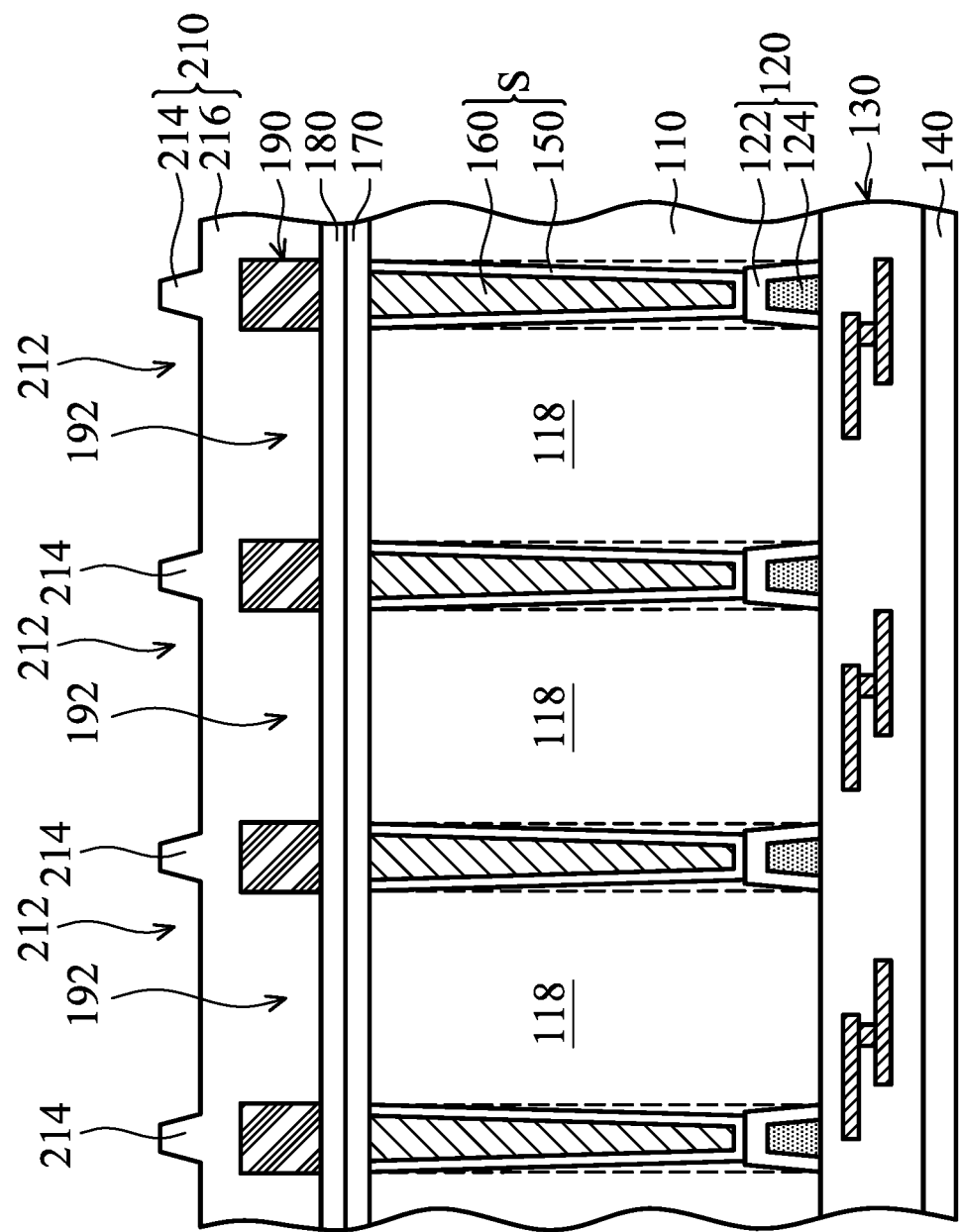
FIGS. 5A-5B are cross-sectional views of various stages of a process for forming an image sensor device, in accordance with some embodiments.
Figure 5B:
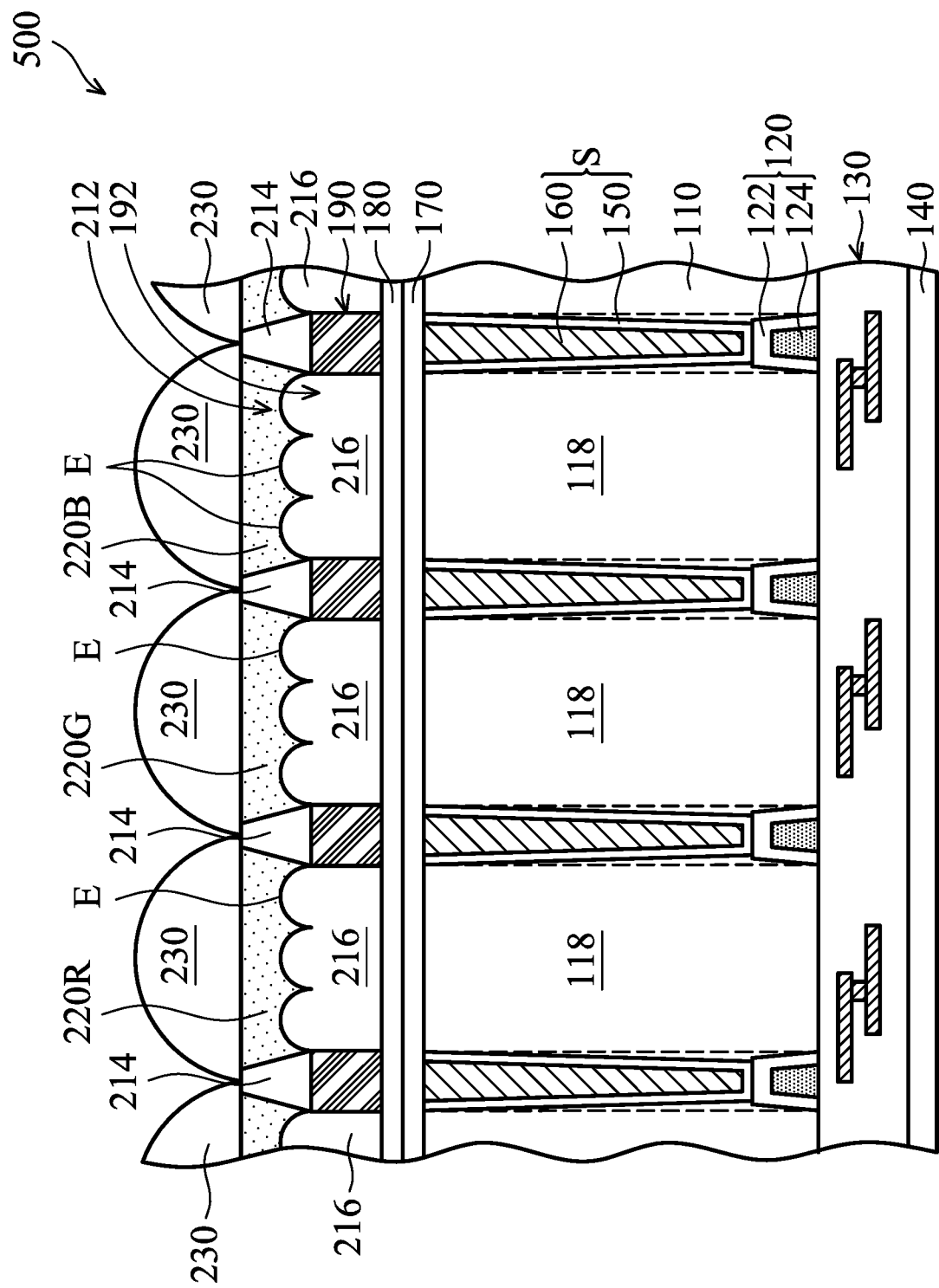

FIGS. 5A-5B are cross-sectional views of various stages of a process for forming an image sensor device 500, in accordance with some embodiments. As shown in FIG. 5A, the steps of FIGS. 1A-1E are performed, in accordance with some embodiments. The recesses 212 of the transparent layer 210 are right over the openings 192 of the grid layer 190, in accordance with some embodiments. The recesses 212 do not extend into the openings 192, in accordance with some embodiments.

As shown in FIG. 5B, the steps of FIGS. 1F-1H are performed, in accordance with some embodiments. The lenses E are positioned outside of the openings 192, in accordance with some embodiments. The lenses E are positioned in the recesses 212, in accordance with some embodiments. In this step, an image sensor device 500 is substantially formed, in accordance with some embodiments.

Figure 6:
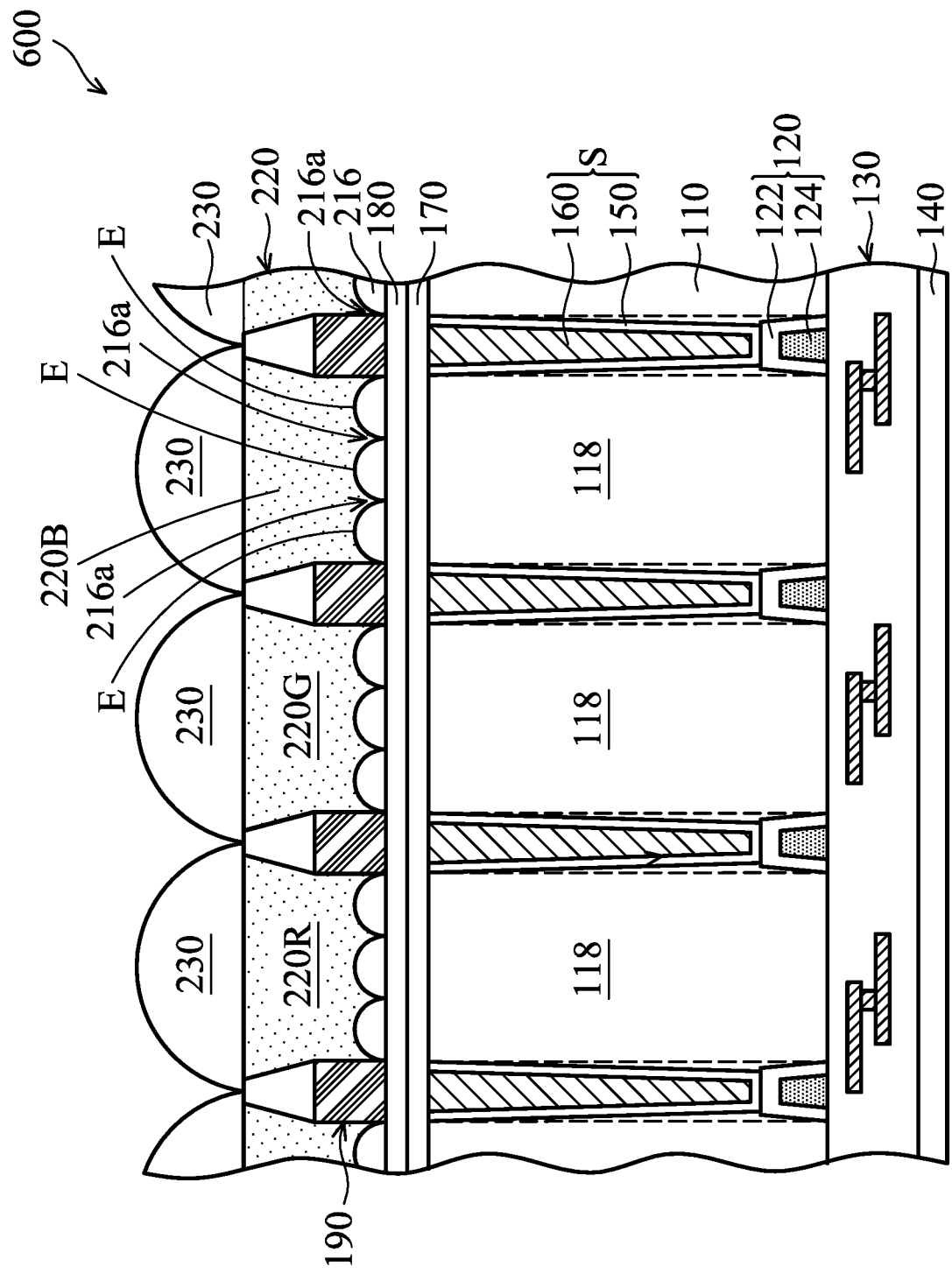
FIG. 6 is a cross-sectional view of an image sensor device, in accordance with some embodiments.

FIG. 6 is a cross-sectional view of an image sensor device 600, in accordance with some embodiments. As shown in FIG. 6, the image sensor device 600 is similar to the image sensor device 100 of FIG. 1H, except that the trenches 216a pass through the base layers 216, in accordance with some embodiments.

Figure 7:
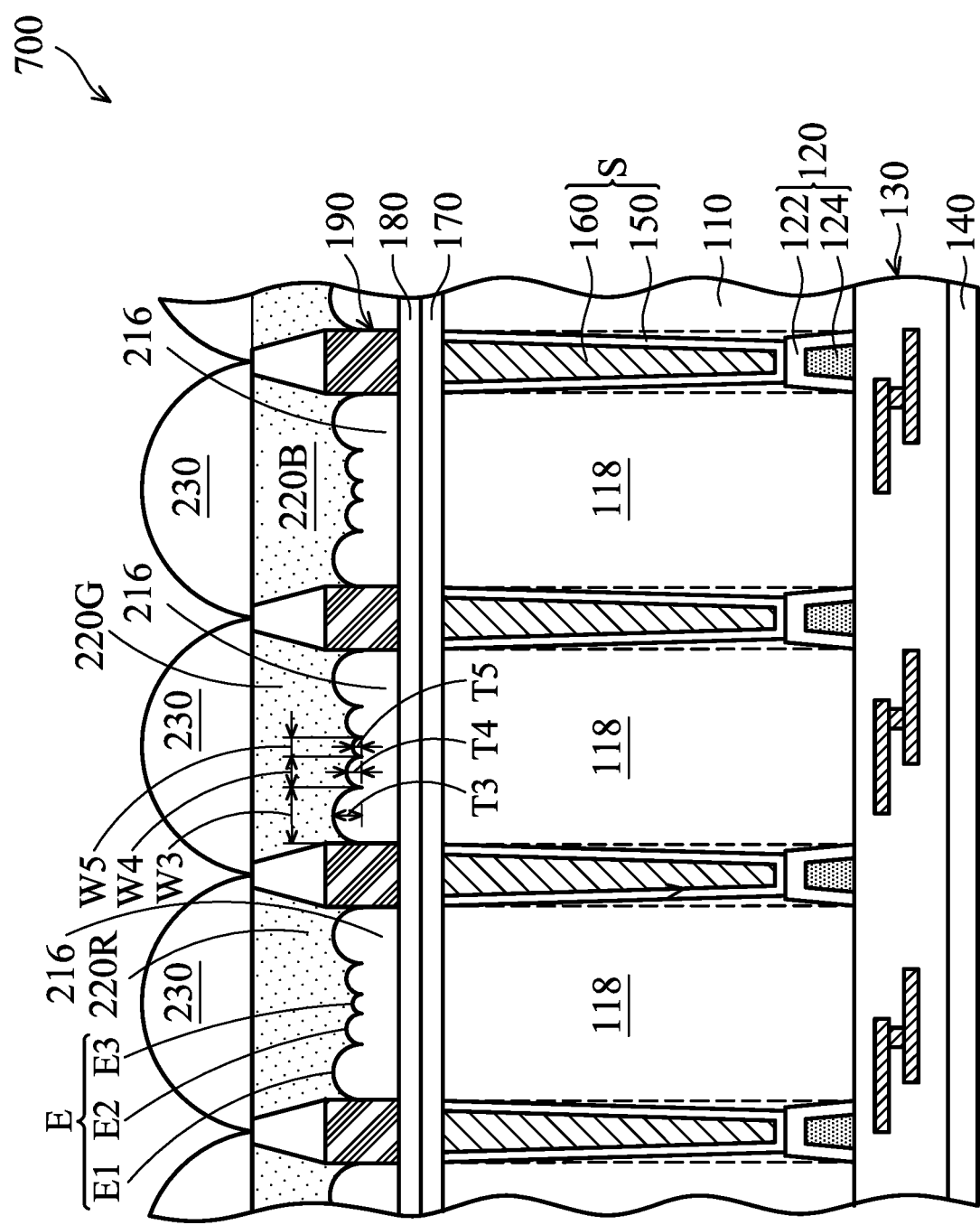
FIG. 7 is a cross-sectional view of an image sensor device, in accordance with some embodiments.

FIG. 7 is a cross-sectional view of an image sensor device 700, in accordance with some embodiments. As shown in FIG. 7, the image sensor device 700 is similar to the image sensor device 100 of FIG. 1H, except that the lenses E of the image sensor device 700 have different widths and different maximum thicknesses, in accordance with some embodiments.

For example, the lenses E include lenses E1, E2, and E3, in accordance with some embodiments. In some embodiments, a width W3 of the lens E1 is greater than a width W4 of the lens E2. In some embodiments, the width W4 is greater than a width W5 of the lens E3. In some embodiments, a maximum thickness T3 of the lens E1 is greater than a maximum thickness T4 of the lens E2. In some embodiments, the maximum thickness T4 is greater than a maximum thickness T5 of the lens E3.

Figure 8:
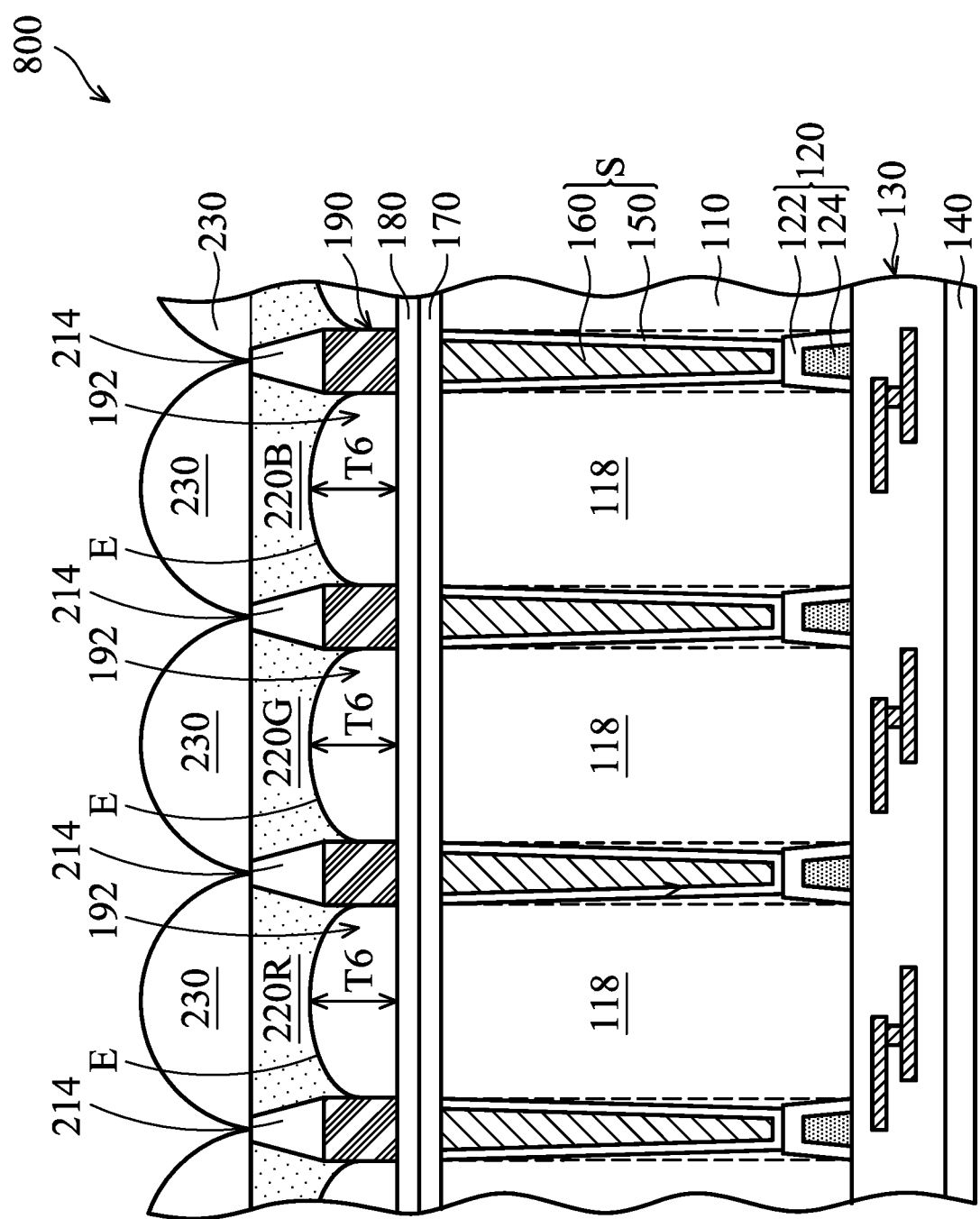
FIG. 8 is a cross-sectional view of an image sensor device, in accordance with some embodiments.

FIG. 8 is a cross-sectional view of an image sensor device 800, in accordance with some embodiments. As shown in FIG. 8, the image sensor device 800 is similar to the image sensor device 100 of FIG. 1H, except that there is only one lens E in each opening 192, in accordance with some embodiments. The image sensor devices 100, 500, 600, 700, and 800 of FIGS. 1H, 5B, and 6-8 are back side image (BSI) sensor devices, in accordance with some embodiments. In one embodiments, the lenses E in the openings 192 have the same maximum thickness T6.

Figure 9:
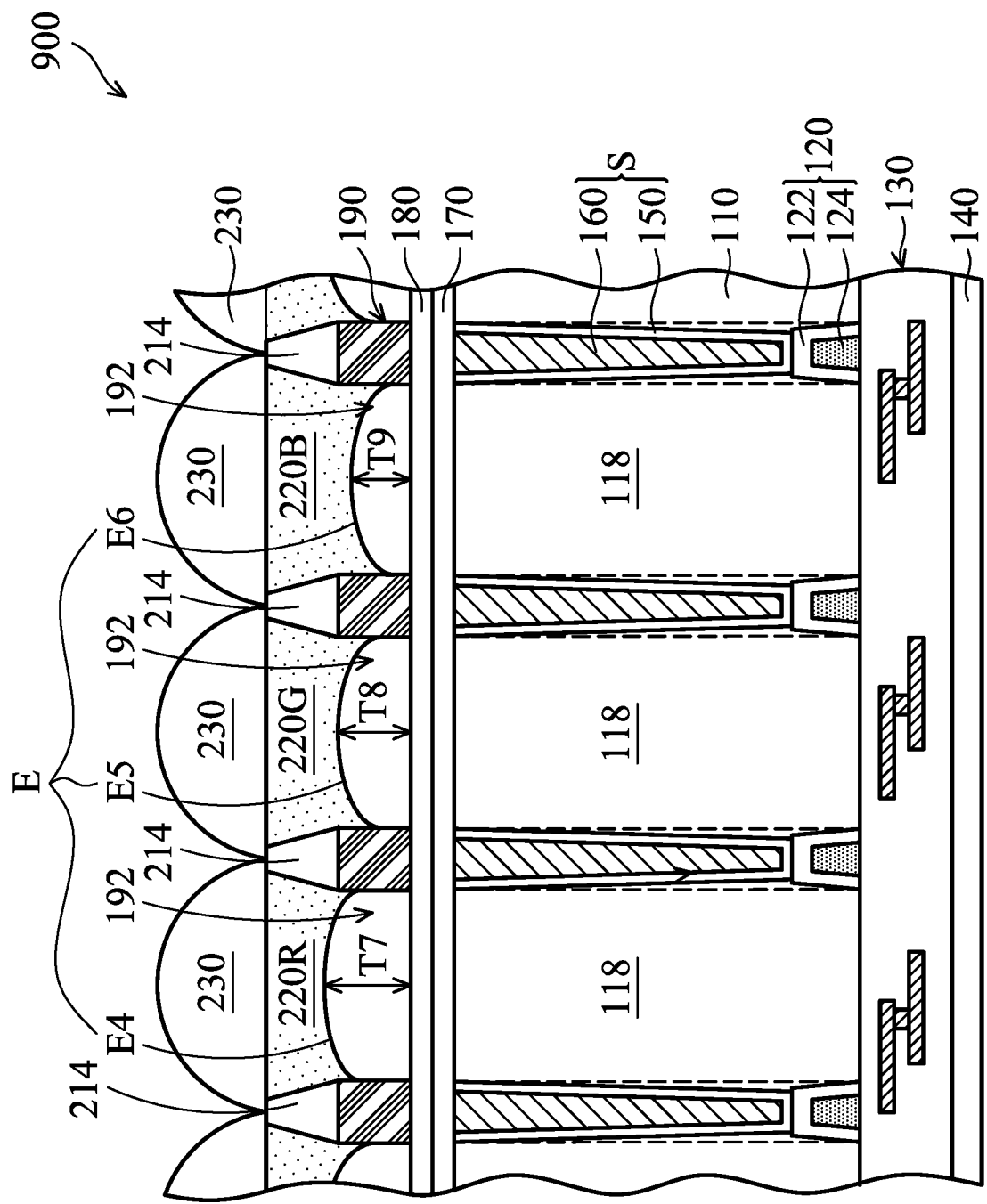
FIG. 9 is a cross-sectional view of an image sensor device, in accordance with some embodiments.

FIG. 9 is a cross-sectional view of an image sensor device 900, in accordance with some embodiments. As shown in FIG. 9, the image sensor device 900 is similar to the image sensor device 800 of FIG. 8, except that the lenses E include lenses E4, E5, E6 having different maximum thicknesses T7, T8, and T9, in accordance with some embodiments. In some embodiments, the maximum thickness T7 of the lens E4 is greater than the maximum thickness T8 of the lens E5. In some embodiments, the maximum thickness T8 is greater than the maximum thickness T9 of the lens E6.

Figure 10:
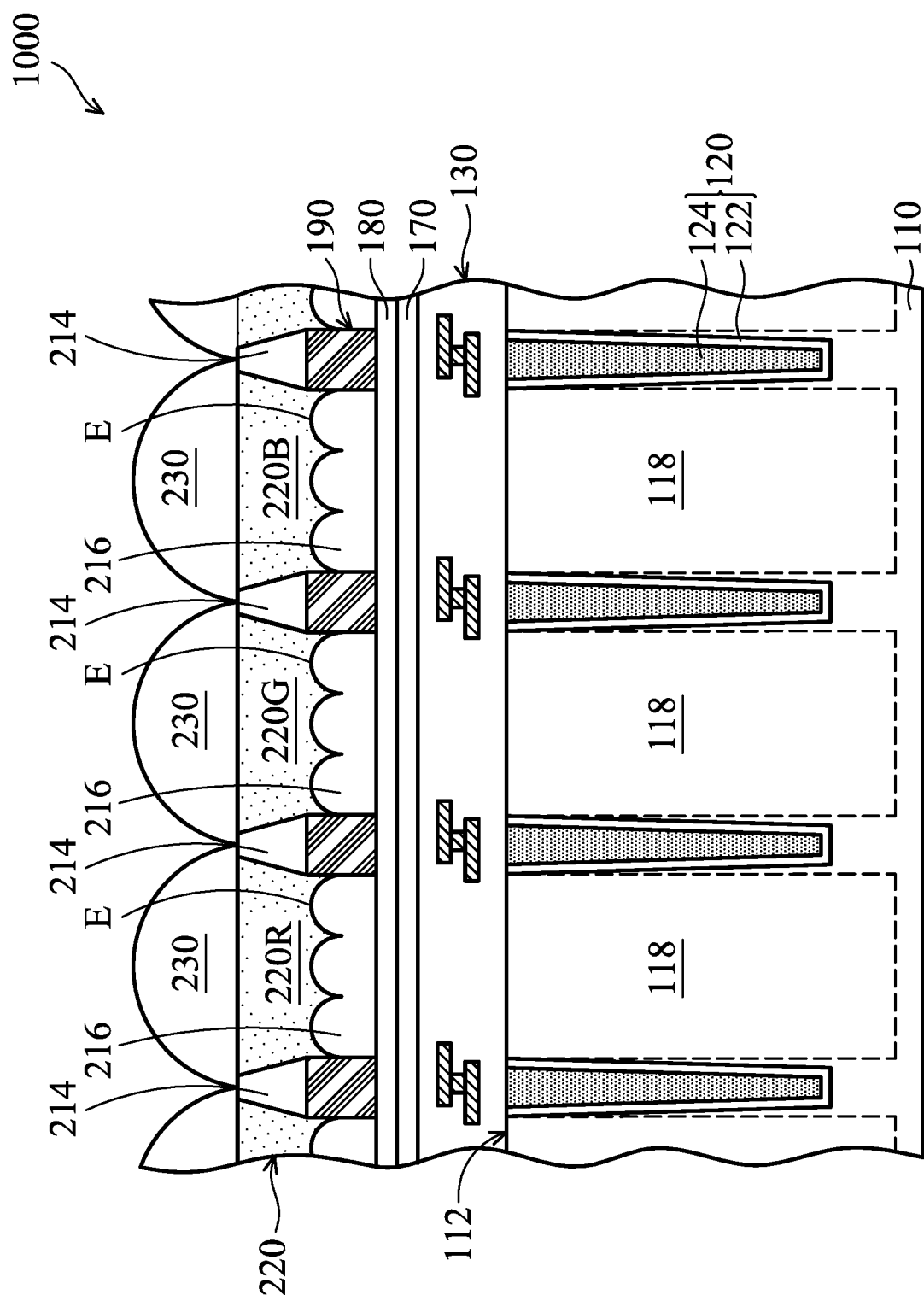
FIG. 10 is a cross-sectional view of an image sensor device, in accordance with some embodiments.

FIG. 10 is a cross-sectional view of an image sensor device 1000, in accordance with some embodiments. As shown in FIG. 10, the image sensor device 1000 is similar to the image sensor device 100 of FIG. 1H, except that the image sensor device 1000 is a front side image sensor device, in accordance with some embodiments.

That is, in the image sensor device 1000, the ARC layer 170, the buffer layer 180, the grid layer 190, the base layers 216 (having the lenses E), the spacer structure 214, the color filter layer 220, and the lenses 230 are formed over the interconnection structure 130 (or the front surface 112 of the semiconductor substrate 110), in accordance with some embodiments. In some embodiments, the image sensor device 1000 does not include the isolation structure S. In some other embodiments (not shown), the image sensor device 1000 includes the isolation structure S.

In accordance with some embodiments, image sensor devices and methods for forming the same are provided. The methods (for forming the image sensor device) form a first lens and a second lens over the first lens, and the first lens is able to direct (or focus) an incident light passing through the second lens to a light-sensing region under the first lens. Therefore, the first lens reduces optical crosstalk between adjacent light-sensing regions. The first lens improves the light collection efficiency of the image sensor device.

In accordance with some embodiments, a method for forming an image sensor device is provided. The method includes forming an isolation structure in a substrate. The method includes forming a light-sensing region in the substrate. The isolation structure surrounds the light-sensing region. The method includes forming a grid layer over the substrate. The grid layer is over the isolation structure and has an opening over the light-sensing region. The method includes forming a first lens in or over the opening. The method includes forming a second lens over the first lens and the grid layer.

In accordance with some embodiments, a method for forming an image sensor device is provided. The method includes forming an isolation structure in a substrate. The method includes forming a light-sensing region in the substrate. The isolation structure surrounds the light-sensing region. The method includes forming a grid layer over the substrate. The grid layer is over the isolation structure and has an opening over the light-sensing region. The method includes forming a transparent layer over the grid layer and in the opening. The method includes forming a recess in the transparent layer. The recess is over the opening. The method includes forming a trench in the transparent layer under the recess. The trench surrounds a first portion of the transparent layer. The method includes rounding the first portion to form a first lens under the recess. The method includes forming a second lens over the first lens and the grid layer.

In accordance with some embodiments, an image sensor device is provided. The image sensor device includes a substrate. The image sensor device includes a light-sensing region in the substrate. The image sensor device includes an isolation structure in the substrate. The isolation structure surrounds the light-sensing region. The image sensor device includes a grid layer over the substrate. The grid layer is over the isolation structure and has an opening over the light-sensing region. The image sensor device includes a first lens in or over the opening. The image sensor device includes a second lens over the first lens and the grid layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor device, comprising:
   forming an isolation structure in a substrate;
   forming a light-sensing region in the substrate, wherein the isolation structure surrounds the light-sensing region;
   forming a grid layer over the substrate, wherein the grid layer is over the isolation structure and has an opening over the light-sensing region, and the grid layer has a first top surface and a bottom surface;
   forming a first lens in the opening, wherein a second top surface of the first lens is between the first stop surface and the bottom surface; and
   forming a second lens over the first lens and the grid layer;
   wherein the forming of the first lens in the opening comprises:
   forming a transparent over the grid layer and in the opening;
   forming a plurality of trenches in the transparent layer, wherein the trenches surround a portion of the transparent layer in the opening; and
   rounding the portion of the transparent layer.

2. The method for forming the image sensor device as claimed in claim 1, wherein the rounding of the portion of the transparent layer comprises:
   performing a reflow process over the portion of the transparent layer.

3. The method for forming the image sensor device as claimed in claim 1, wherein the rounding of the portion of the transparent layer comprises:
   performing a wet etching process over the portion of the transparent layer.

4. The method for forming the image sensor device as claimed in claim 1, wherein the forming of the trench in the transparent layer comprises:
   performing a dry etching process over the transparent layer.

5. The method for forming the image sensor device as claimed in claim 1, wherein the forming of the first lens in the opening further comprises:
   forming a third lens in the opening, wherein the second lens is over the third lens.

6. The method for forming the image sensor device as claimed in claim 1, wherein a first maximum width of the first lens is less than a second maximum width of the second lens.

7. The method for forming the image sensor device as claimed in claim 1, further comprising:
   forming a color filter layer over the first lens before forming the second lens over the first lens and the grid layer, wherein the second lens is formed over the color filter layer.

8. A method for forming an image sensor device, comprising: forming an isolation structure in a substrate;
forming a light-sensing region in the substrate, wherein the isolation structure surrounds the light-sensing region;
forming a grid layer over the substrate, wherein the grid layer is over the isolation structure and has an opening over the light-sensing region, and the grid layer has a top surface facing away from the isolation structure and the substrate;
forming a transparent layer over the top surface of the grid layer and in the opening;
forming a recess in the transparent layer, wherein the recess is over the opening;
forming a plurality of trenches in the transparent layer under the recess, wherein the trenches surround a first portion of the transparent layer;
after forming the trenches in the transparent layer under the recess, rounding the first portion to form a first lens under the recess; and
forming a second lens over the first lens and the grid layer.

9. The method for forming the image sensor device as claimed in claim 8, further comprising:
forming a color filter layer in the recess and the trenches after forming the first lens and before forming the second lens, wherein the second lens is formed over the color filter layer.

10. The method for forming the image sensor device as claimed in claim 9, wherein the color filter layer is in direct contact with the first lens.

11. The method for forming the image sensor device as claimed in claim 9, wherein the color filter layer is between the first lens and the second lens and is in direct contact with the first lens and the second lens.

12. The method for forming the image sensor device as claimed in claim 9, wherein the color filter layer in the trenches surrounds the first lens.

13. The method for forming the image sensor device as claimed in claim 8, wherein a first maximum thickness of the first lens is less than a second maximum thickness of the second lens.

14. The method for forming the image sensor device as claimed in claim 8, wherein the trenches further surround a second portion of the transparent layer, and the rounding of the first portion to form the first lens under the recess further comprises:
rounding the second portion to form a third lens under the recess.

15. A method for forming an image sensor device, comprising:
forming an isolation structure in a substrate;
forming a light-sensing region in the substrate, wherein the isolation structure surrounds the light-sensing region;
forming a grid layer over the substrate, wherein the grid layer is over the isolation structure and has an opening over the light-sensing region;
forming a first lens in the opening; and
forming a second lens over the first lens,
wherein the forming of the first lens in the opening comprises:
forming a transparent layer over the grid layer and in the opening;
forming a plurality of trenches in the transparent layer, wherein the trenches surround a portion of the transparent layer in the opening, and the trenches pass through the transparent layer; and
rounding the portion of the transparent layer.

16. The method for forming the image sensor device as claimed in claim 15, further comprising:
forming a color filter layer in the trenches after forming the first lens and before forming the second lens, wherein the second lens is formed over the color filter layer.

17. The method for forming the image sensor device as claimed in claim 16, wherein the color filter layer is in direct contact with the first lens.

18. The method for forming the image sensor device as claimed in claim 17, wherein the color filter layer is in direct contact with the second lens and the grid layer.

19. The method for forming the image sensor device as claimed in claim 15, wherein after the forming of the first lens, the transparent layer is partially remained over the grid layer.

* * * * *